(12) United States Patent
Kiuchi et al.

(10) Patent No.: US 8,058,565 B2
(45) Date of Patent: Nov. 15, 2011

(54) WIRING BOARD, SEMICONDUCTOR DEVICE, AND METHOD FOR MANUFACTURING WIRING BOARD

(75) Inventors: Yukihiro Kiuchi, Tokyo (JP); Masahiro Ishibashi, Tokyo (JP); Yoshitaka Kyogoku, Tokyo (JP)

(73) Assignee: NEC Corporation (JP)

( * ) Notice: Subject to any disclaimer, the term of this patent is extended or adjusted under 35 U.S.C. 154(b) by 1269 days.

(21) Appl. No.: 11/568,111

(22) PCT Filed: Apr. 15, 2005

(86) PCT No.: PCT/JP2005/007325
§ 371 (c)(1),
(2), (4) Date: Oct. 19, 2006

(87) PCT Pub. No.: WO2005/104230
PCT Pub. Date: Nov. 3, 2005

(65) Prior Publication Data
US 2007/0274060 A1    Nov. 29, 2007

(30) Foreign Application Priority Data
Apr. 23, 2004   (JP) ................................. 2004-128948

(51) Int. Cl.
*H05K 1/00* (2006.01)
*H05K 1/16* (2006.01)
(52) U.S. Cl. .......................... 174/258; 174/260; 361/783
(58) Field of Classification Search .................. 174/258, 174/260; 361/783
See application file for complete search history.

(56) References Cited

U.S. PATENT DOCUMENTS

| 6,198,160 B1 * | 3/2001 | Yamaguchi ................... 257/676 |
| 6,660,942 B2 * | 12/2003 | Horiuchi et al. ............... 174/258 |
| 6,663,946 B2 * | 12/2003 | Seri et al. ...................... 428/209 |
| 6,756,685 B2 | 6/2004 | Tao ................................. 257/778 |
| 2003/0219588 A1 * | 11/2003 | Ogawa et al. ............... 428/308.4 |
| 2004/0168824 A1 * | 9/2004 | Sekido .......................... 174/256 |

FOREIGN PATENT DOCUMENTS

| JP | 04-207097 | 7/1992 |
| JP | 06-021594 | 1/1994 |
| JP | 11-040931 | 2/1999 |
| JP | 2000-174440 | 6/2000 |
| JP | 2001-081282 | 3/2001 |
| JP | 2002-198462 | 7/2002 |
| JP | 2003-051568 | 2/2003 |
| JP | 2003-311887 | 6/2003 |
| JP | 2004-027213 | 1/2004 |

OTHER PUBLICATIONS

Japanese Official Action dated Mar. 15, 2011.
Japanese Official Action dated Sep. 13, 2011, with translation.

* cited by examiner

*Primary Examiner* — Jeremy Norris
(74) *Attorney, Agent, or Firm* — Hayes Soloway P.C.

(57) ABSTRACT

In a semiconductor device (1), a package board (2) is provided in which a plurality of wiring layers are layered, a plurality of mounting pads (5) arranged in a matrix are provided to the uppermost wiring layer of the package board (2), and solder bumps (7) are connected to the mounting pads (5). A semiconductor chip (9) is mounted on the package board (2) via the solder bumps (7). The uppermost wiring layer of the package board (2) is formed from a resin material in which the Young's modulus is 1 GPa or lower when the temperature is 10 to 30° C., and the elongation at break is 50% or higher.

10 Claims, 6 Drawing Sheets

PRIOR ART

WIRING BOARD, SEMICONDUCTOR DEVICE, AND METHOD FOR MANUFACTURING WIRING BOARD

TECHNICAL FIELD

The present invention relates to a wiring board, to a semiconductor device in which a semiconductor chip is mounted on the wiring board, and to a method for manufacturing a wiring board.

BACKGROUND ART

A technique has been developed in recent years for reducing the size of a semiconductor device by arranging a plurality of solder balls in advance on the surface of a wiring board, placing the semiconductor chip over the solder balls, and connecting the semiconductor chip to the wiring board by melting the solder balls. Examples of this type of semiconductor device include a FCBGA (Flip Chip Ball Grid Array) and a WLCSP (Wafer Level Chip Size Package). Wiring boards also include multilayer wiring boards in which a plurality of resin layers having wiring embedded therein are layered, e.g., an MLTS (Multi Layer Thin Substrate) (trade name) structure and other package substrates.

However, this technique has such problems as the following. Specifically, the silicon material of the semiconductor chip and the resin of the wiring board have different thermal expansion coefficients. Therefore, even when care is taken so as to place the semiconductor chip on the wiring board without applying force to the solder balls during mounting, the semiconductor chip and the wiring board still contract differently from each other when the semiconductor device is cooled to room temperature, causing warping in the semiconductor device, and exerting force on the solder balls. When the semiconductor device is subjected to repeated cycles of heating and cooling from changes in the outside temperature and heat that accompanies the operation of the semiconductor chip, fatigue fracture can occur in the solder balls, and electrical connections can be broken.

Attempts have been made in the past to form a wiring board from as hard a resin as possible in order to prevent this problem and enhance the reliability of connections in the semiconductor device. This was to minimize warping of the semiconductor device and the deformation of the wiring board by increasing the rigidity of the wiring board. For example, a technique is disclosed in Patent Reference 1 in which an insulating material having an elastic modulus of 10 GPa or higher is used as the material for forming the wiring board.

[Patent Reference 1] Japanese Laid-Open Patent Application No. 2002-198462

DISCLOSURE OF THE INVENTION

Problems the Invention is Intended to Solve

However, the conventional techniques described above have such problems as the following. Specifically, as described in Patent Reference 1, even when the wiring board is formed from a material having an elastic modulus of 10 GPa or higher, the connections in the semiconductor device are not adequately reliable with respect to temperature cycles.

The present invention was developed in view of the foregoing problems, and an object thereof is to provide a wiring board and semiconductor device having connections that are highly reliable with respect to temperature cycles, and to provide a method for manufacturing a wiring board.

Means for Solving the Abovementioned Problems

The wiring board according to the present invention comprises a wiring layer composed of wiring and an insulating material, wherein the insulating material is a material having a Young's modulus of 1 GPa or lower in a temperature range of 10 to 30° C.

In the present invention, by forming the wiring layer of the wiring board from a relatively soft insulating material having a Young's modulus of 1 GPa or lower in a temperature range of 10 to 30° C., the thermal expansion of the wiring layer can be made to conform to that of the external element when a semiconductor chip or other external element is mounted to the wiring board to form a semiconductor device, and the semiconductor device is then heated or cooled. Warping of the semiconductor device can thereby be suppressed, and force applied to the connections between the wiring board and the external element can be reduced. The reliability of connections with respect to the temperature cycle of the semiconductor device can therefore be enhanced. The wiring also includes vias, pads, and other conducting members.

The wiring board according to another aspect of the present invention is a wiring board in which a plurality of wiring layers composed of wiring and an insulating material are layered, and is characterized in that the insulating material for forming the wiring layers disposed on a surface electrically connected to an external element is a material having a Young's modulus of 1 GPa or lower in a temperature range of 10 to 30° C.

It is also preferred that the material having a Young's modulus of 1 GPa or lower have an elongation at break of 50% or higher. The reliability of the semiconductor device is thereby enhanced even further.

The semiconductor device according to the present invention is characterized in comprising the wiring board, a semiconductor chip, and a plurality of terminals for connecting the wiring board and the semiconductor chip to each other, wherein the insulating material for forming the wiring layer disposed on the side of the wiring board on which the semiconductor chip is mounted is a material having a Young's modulus of 1 GPa or lower.

There may also be a plurality of other terminals connected to the side of the wiring board on which the semiconductor chip is mounted, for connecting the wiring board to a circuit board. In this instance, it is preferred that the insulating material for forming the wiring layer disposed on the side to which the other terminals are connected be a material having a Young's modulus of 1 GPa or lower in a temperature range of 10 to 30° C. The reliability of connections with the circuit board when the semiconductor device of the present invention is mounted to a circuit board can thereby be enhanced. The term "circuit board" herein refers to a motherboard or other board, and is a board other than the wiring board constituting a portion of the semiconductor device.

The semiconductor device according to another aspect of the present invention is characterized in comprising the wiring board, a semiconductor chip, a plurality of terminals for connecting the wiring board and the semiconductor chip to each other, and a plurality of other terminals connected to the side of the wiring board other than the side on which the semiconductor chip is mounted, for connecting the wiring board to a circuit board, wherein the insulating material for forming the wiring layer disposed on the side of the wiring board mounted to the circuit board is the material having a Young's modulus of 1 GPa or lower.

The method for manufacturing a wiring board according to the present invention is characterized in comprising forming a wiring layer composed of wiring and an insulating material on a support substrate, and removing at least a portion of the support substrate, wherein the insulating material comprises a material having a Young's modulus of 1 GPa or lower in a temperature range of 10 to 30° C.

There may also be a step for forming a reinforcing panel on the lower surface of the wiring board after removing at least a portion of the support substrate, or a reinforcing panel may be formed with a portion of the support substrate remaining in a step for removing at least a portion of the support substrate.

EFFECT OF THE INVENTION

According to the present invention, by forming the wiring layer of the wiring board from a insulating material having a Young's modulus of 1 GPa or lower in a temperature range of 10 to 30° C., the thermal expansion of the wiring layer can be made to conform to that of the external element when an external element is mounted to the wiring board. Warping of the wiring board and breakage of the connected portions can therefore be prevented, and the reliability of connections with respect to temperature cycles can be enhanced.

BRIEF DESCRIPTION OF THE DRAWINGS

FIGS. 5A and 5B are perspective views of the present simulation results, wherein FIG. 5A shows an embodiment of the present invention, and FIG. 5B shows a comparative example;

Figure 1:
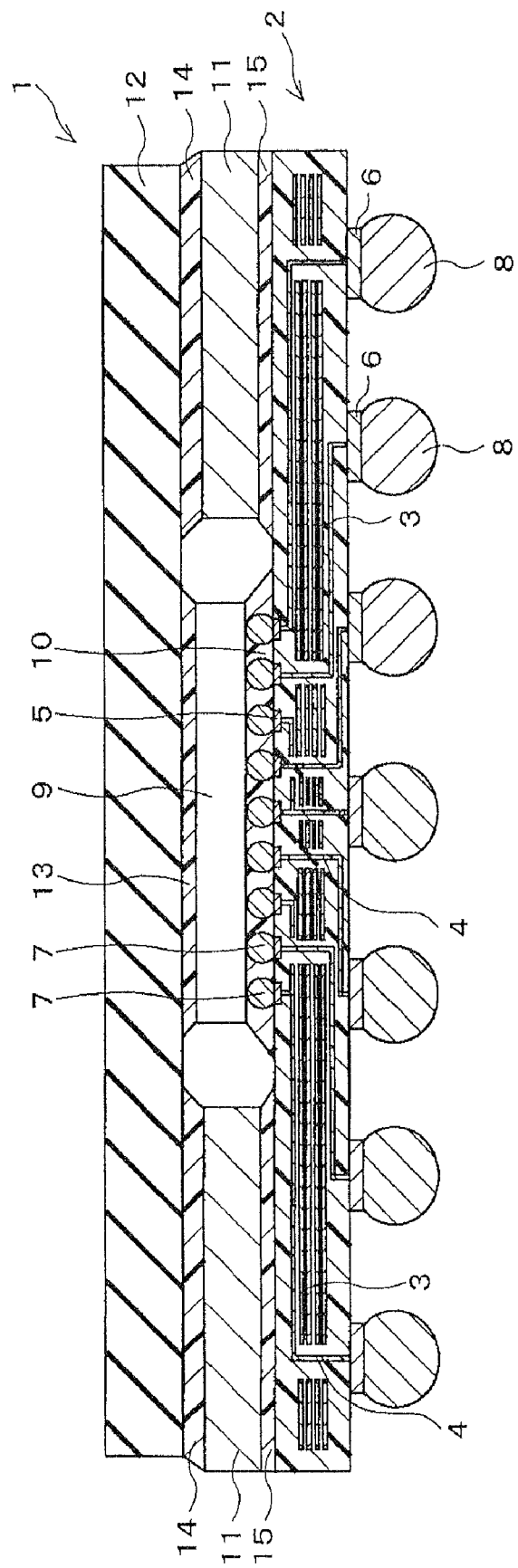
FIG. 1 is a sectional view of the semiconductor device according to an embodiment of the present invention.

KEY TO SYMBOLS 1, 21: semiconductor device
2, 22: package board
3: wiring
4: via
5: mounting pad
6: ball pad
7: solder bump
8: BGA ball
9, 29: semiconductor chip
10, 30: underfill resin
11, 31: stiffener
12: lid
13, 14, 15: adhesive layer
16: wiring layer
37: solder resist
38: adhesion layer
41: comb-shaped wiring
42: electrode
43: evaluation board
44: FR-4 board
45: wiring
46: via
47, 49, 51: Cu pattern
48: buildup resin layer
50: solder resist
S, T: junction
W: plane of symmetry

BEST MODE FOR CARRYING OUT THE INVENTION

Figure 2:
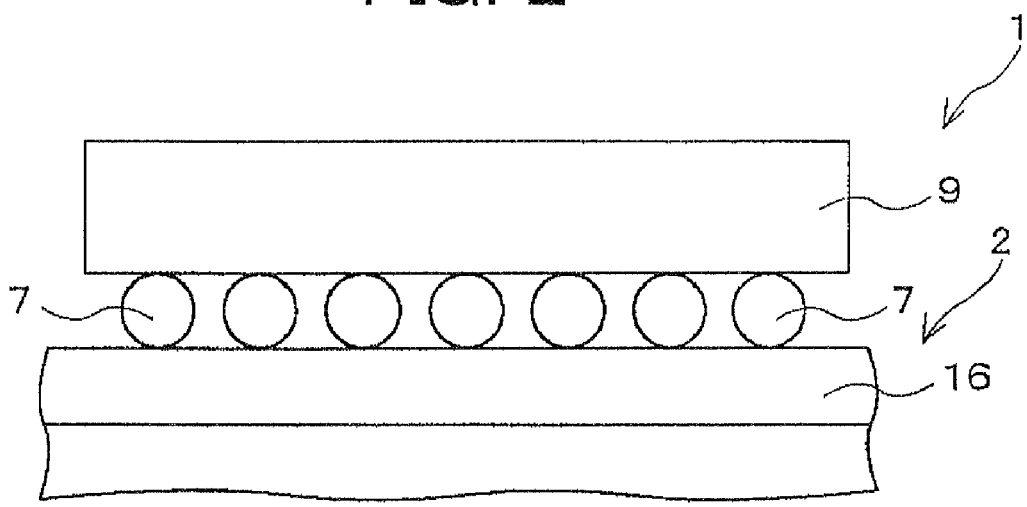
FIG. 2 is a schematic view of the characteristics of the semiconductor device.

Embodiments of the present invention will be described in detail hereinafter with reference to the accompanying drawings. FIG. 1 is a sectional view of the semiconductor device according to the present embodiment, and FIG. 2 is a schematic view of the characteristics of this semiconductor device. As shown in FIG. 1, the semiconductor device 1 according to the present embodiment is an FCBGA-type semiconductor device. A package board 2 is provided to the semiconductor device 1. The package board 2 is formed by the layering of a plurality of wiring layers, and wiring 3 composed, for example, of copper, and vias 4 connected to the wiring 3 are formed in each wiring layer. A plurality of mounting pads 5 are formed in the uppermost wiring layer 16 (see FIG. 2) of the package board 2. The wiring 3, vias 4, and mounting pads 5 are also referred to collectively as wiring. A plurality of ball pads 6 are formed on the lower surface of the package board 2. The mounting pads 5 and the ball pads 6 are arranged in a matrix as viewed from the direction perpendicular to the upper surface (hereinafter referred to as "in plan view") of the package board 2.

In a plan view, the ball pads 6 are larger than the mounting pads 5, and the interval at which the ball pads 6 are arranged is larger than the interval at which the ball pads 6 are arranged. The mounting pads 5 are connected to the ball pads 6 via the wiring 3 and the vias 4. Solder bumps 7 are connected to the mounting pads 5, and BGA balls 8 are connected to the ball pads 6.

A semiconductor chip 9 is mounted on the package board 2. In the semiconductor chip 9, a multilayer wiring layer (not shown) is provided on a silicon substrate (not shown), and an integrated circuit is formed on the surface of the silicon substrate and in the multilayer wiring layer, for example. Input/output pads (not shown) are provided to the surface of the multilayer wiring layer, i.e., the surface on the side opposite the package board 2, in the semiconductor chip 9. The input/output pads are connected to the solder bumps 7. The input/output pads of the semiconductor chip 9 are thereby connected to the mounting pads 5 via the solder bumps 7, and are also connected to the BGA balls 8 via the wiring 3, the vias 4, and the ball pads 6. An underfill resin 10 is filled into the area surrounding the solder bumps 7 between the package board 2 and the semiconductor chip 9. The semiconductor chip 9 is thereby connected to and fixed with respect to the package board 2.

Stiffeners 11 composed of stainless steel or copper, for example, are provided to the regions surrounding the semiconductor chip 9 on the package board 2. The stiffeners 11 are bonded to the package board 2 by an adhesive layer 15. The stiffeners 11 are frame-shaped in plan view, and the open portion thereof encloses the semiconductor chip 9. The upper surface of the semiconductor chip 9 is in substantially the same plane as the upper surface of the semiconductor chip 9.

A lid 12 composed of a ceramic material, for example, is furthermore provided on the semiconductor chip 9 and the stiffeners 11. The lid 12 is bonded to the semiconductor chip 9 by an adhesive layer 13, and is bonded to the stiffeners 11 by an adhesive layer 14. The lid 12 is shaped so as to substantially overlap the package board 2 in plan view. The lid 12 functions as a heat sink for the semiconductor chip 9. The semiconductor device 1 is furthermore designed to be mounted to a motherboard (not shown) or the like via the BGA balls 8.

The uppermost wiring layer of the package board 2, i.e., the wiring layer 16 (see FIG. 2) on which the mounting pads 5 are formed and which is disposed on the surface opposite the semiconductor chip 9, is formed from an insulating material having a Young's modulus of 1 GPa or lower when the temperature is 10 to 30° C. (hereinafter referred to as "room temperature") and an elongation at break of 20% or higher. This insulating material contains an elastomer (A; hereinafter referred to as "reactive elastomer") capable of reacting with epoxy resins, an epoxy resin (B), and a curing agent (C) for the epoxy resin. The value $(A \times 100)/(A+B+C)$ is 50 mass % or higher and less than 100 mass %, where A is the content of the reactive elastomer, B is the content of the epoxy resin, and C is the content of the epoxy resin curing agent.

When the value of $(A \times 100)/(A+B+C)$ is less than 50 mass %, the amount of the reactive elastomer for maintaining the toughness of the resin material is inadequate, and an adequate elongation at break cannot be obtained. This value is therefore set to 50 mass % or higher.

Reactive elastomer (A) is a polyamide-polybutadiene-acrylonitrile copolymer containing a phenolic hydroxyl group, for example. The polyamide-polybutadiene-acrylonitrile copolymer (also referred to simply as "copolymer" hereinafter) containing a phenolic hydroxyl group is obtained by reacting the dicarboxylic acid having a phenolic hydroxyl group indicated by Formula 1 below, the dicarboxylic acid not having a phenolic hydroxyl group indicated by Formula 2 below, the diamine indicated by Formula 3 below, and the polybutadiene-acrylonitrile copolymer having carboxylic acids at both terminals thereof indicated by Formula 4 below. The polyamide-polybutadiene-acrylonitrile copolymer containing a phenolic hydroxyl group is indicated by Formula 5 below as a general formula.

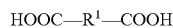                                    [Formula 1]

$R^1$ in Formulae 1 and 5 is a $C_{6-12}$ bivalent aromatic compound having a phenolic hydroxyl group. Examples of dicarboxylic acids having a phenolic hydroxyl group indicated by Formula 1 include 5-hydroxyisophthalic acid, 4-hydroxyisophthalic acid, 2-hydroxyphthalic acid, 3-hydroxyphthalic acid, 2-hydroxyterephthalic acid, and the like.

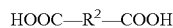                                    [Formula 2]

$R^2$ in Formulae 2 and 5 is a $C_{6-12}$ bivalent aromatic compound not having a phenolic hydroxyl group, or a $C_{1-10}$ bivalent aliphatic compound. Examples of the dicarboxylic acid not having a phenolic hydroxyl group indicated by Formula 2 include phthalic acid, isophthalic acid, terephthalic acid, dicarboxyl naphthalene, succinic acid, fumaric acid, glutamic acid, adipic acid, 1,3-cyclohexane dicarboxylic acid, 4,4'-diphenyl dicarboxylic acid, 3,3'-methylene dibenzoic acid, and the like.

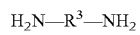                                    [Formula 3]

$R^3$ in Formulae 3 and 5 is a $C_{6-12}$ bivalent aromatic compound or a $C_{1-10}$ bivalent aliphatic compound. Among the diamines indicated by Formula 3, diamines containing a phenolic hydroxyl group include 3,3'-diamine-4,4'-dihydroxyphenyl methane, 2,2'-bis(3-amino-4-hydroxyphenyl) hexafluoropropane, 2,2'-bis(3-amino-4-hydroxyphenyl) difluoromethane, 3,4'-diamino-1,5'-benzenediol, 3,3'-dihydroxy-4,4'-diaminobisphenyl, 3,3'-diamino-4,4'-dihydroxybiphenyl, 2,2'-bis(3-amino-4-hydroxyphenyl) ketone, 2,2'-bis(3-amino-4-hydroxyphenyl)sulfide, 2,2'-bis (3-amino-4-hydroxyphenyl)ether, 2,2'-bis(3-amino-4-hydroxyphenyl)sulfone, 2,2'-bis(3-amino-4-hydroxyphenyl) propane, 2,2'-bis(3-amino-4-aminophenyl)propane, 2,2'-bis (3-amino-4-aminophenyl)methane, and the like. Diamines not containing a phenolic hydroxyl group include 3,3'-diaminodiphenyl ether, 3,4'-diaminodiphenyl ether, 4,4'-diaminodiphenyl ether, diaminonaphthalene, piperazine, hexamethylene diamine, tetramethylene diamine, m-xylene diamine, 4,4'-diaminodiphenyl methane, 4,4'-diaminobenzophenone, 2,2'-bis(4-aminophenyl)propane, 3,3'-diaminodiphenyl sulfone, 3,3'-diaminodiphenyl, and the like. A particularly preferred diamine is 3,4'-diaminodiphenyl ether, but this example is not limiting.

[Formula 4]

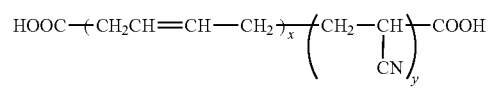

The symbol x in Formula 4 shown above and Formulae 5 and 6 below indicates an average degree of polymerization, and is an integer from 3 to 7; y indicates an average degree of polymerization, and is an integer from 1 to 4.

[Formula 5]

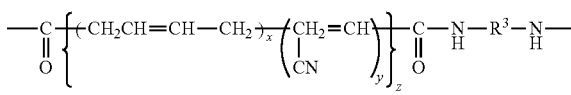

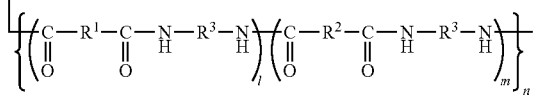

In Formula 5 above and Formula 6 below, each of z, l, m, and n is an average degree of polymerization; z is an integer from 5 to 15; n=l+ m, and n is an integer from 2 to 200; and l and m satisfy the relation $m/(l+m) \geqq 0.04$.

The copolymers indicated by Formula 6 as a general formula below are particularly preferred among copolymers indicated by Formula 5 above.

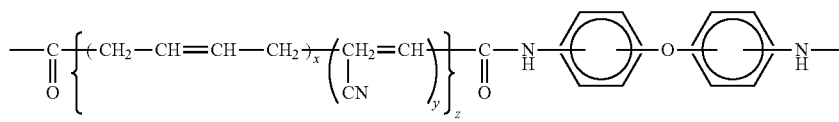

[Formula 6]

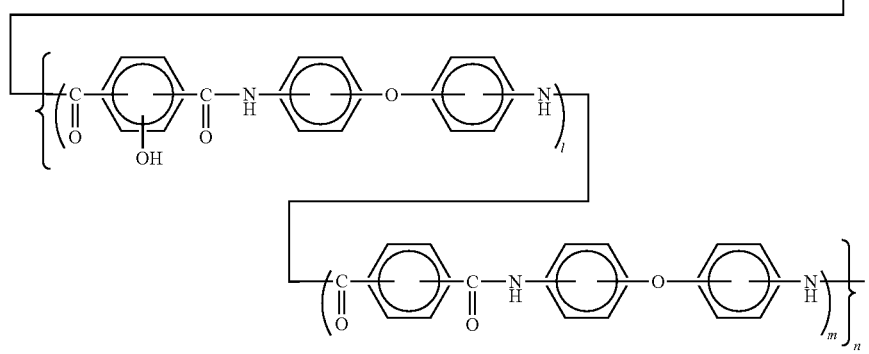

When the weight-average molecular weight (Mw) of the abovementioned copolymer is 100,000 or less, adequate fluidity in a temperature range of 160 to 180° C. can be obtained. Fluidity is also satisfactory in the temperature range of 100 to 160° C. when the weight-average molecular weight is 20,000 or less. Accordingly, the weight-average molecular weight (Mw) of the abovementioned copolymer is preferably 100,000 or less, and more preferably 20,000 or less.

A resin (D) having a greater distance between functional groups than the phenol novolac resin included in epoxy resin curing agent (C) is indicated by Formula 7 below, for example.

[Formula 7]

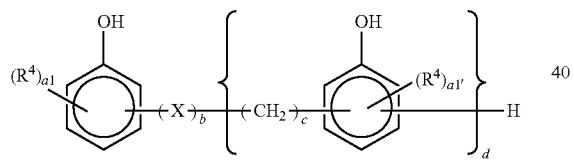

In Formula 7, $R^4$ is a $C_{1-3}$ monovalent substituent or a hydrogen atom; a1 is an integer from 1 to 4; a1' is an integer from 1 to 3; X is compound $X_1$ indicated by Formula 9 below, or compound $X_2$ indicated by Formula 10 below; b is an integer from 1 to 10; and each of c and d is 1.

An ethylene oxide compound having a phenolic hydroxyl group, i.e., ethylene oxide, as the functional group, wherein the distance between the phenolic hydroxyl groups in the molecular structure is greater than the distance between the phenolic hydroxyl groups in a phenol novolac resin, may be cited as an example of the resin (D) in which the distance between the functional groups is greater than in the phenol novolac resin indicated by Formula 7. An example thereof is the ethylene oxide compound indicated by Formula 8 below.

[Formula 8]

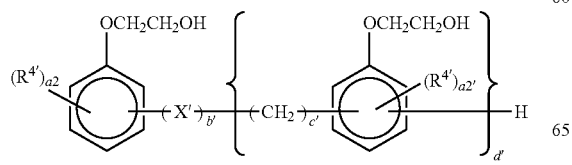

In Formula 8, $R^{4'}$ is a $C_{1-3}$ monovalent substituent or a hydrogen atom; a2 is an integer from 1 to 4; a2' is an integer from 1 to 3; X' is compound $X_1$ indicated by Formula 9 below, or compound $X_2$ indicated by Formula 10 below; b' is an integer from 1 to 10; and each of c' and d' is 1.

[Formula 9]

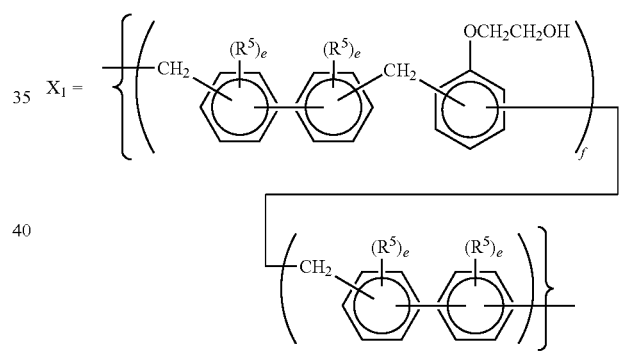

In Formula 9, $R^5$ is a $C_{1-3}$ monovalent substituent or a hydrogen atom; e is an integer from 1 to 4; and f is an integer from 0 to 9.

[Formula 10]

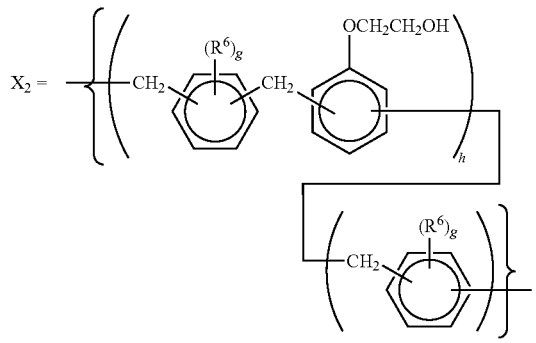

In Formula 10, $R^6$ is a $C_{1-3}$ monovalent substituent or a hydrogen atom; g is an integer from 1 to 4; and h is an integer from 0 to 9.

In the resins indicated by Formulae 7 and 8, the distance between the functional groups is greater than in the phenol novolac resin indicated by Formula 11 below.

[Formula 11]

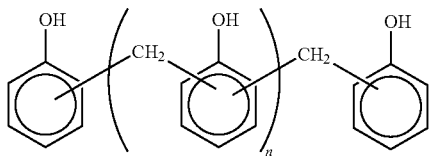

In the present invention, epoxy resin (B) is not subject to any particular limitation, but is preferably an epoxy resin in which the distance between the functional groups is greater than in a phenol novolac epoxy resin. The reason for this is that an IPN structure can be efficiently formed with this type of epoxy resin, which results in an even further enhancement of the elongation at break of the resin material of the present embodiment. This type of epoxy resin, in which the distance between the functional groups is greater than in a phenol novolac epoxy resin, includes phenol biphenylene aralkyl-type epoxy resins, phenol xylene aralkyl-type epoxy resins, phenol diphenyl ether aralkyl-type epoxy resins, bifunctional biphenyl-type epoxy resins, anthracene-containing novolac-type epoxy resins, fluorine-containing novolac-type epoxy resins, bisphenol fluorene-containing novolac-type epoxy resins, phenol biphenylene triazine-type epoxy resins, and phenol xylene triazine-type epoxy resins. Also included are phenoxy resins in which both terminals are epoxy groups and which belong to the bisphenol A type, the bisphenol F type, the bisphenol S type, and a type that contains a biphenyl backbone. This phenoxy resin has a weight-average molecular weight of about 20,000 to 100,000, given in terms of the equivalent polystyrene molecular weight. Epoxy resin (B) may be any one of these epoxy resins or a mixture of multiple types thereof.

No particular limitations are imposed on epoxy resins other than the epoxy resins that have the aforementioned long distance between functional groups and are selected from among the epoxy resins included in the resin material of the present embodiment. Examples of such resins include bisphenol A-type epoxy resins, bisphenol F-type epoxy resins, bisphenol S-type epoxy resins, naphthalene diol-type epoxy resins, phenol novolac epoxy resins, cresol novolac epoxy resins, novolac-type epoxy resins containing bisphenol F, novolac-type epoxy resins containing bisphenol A, phenol triazine-type epoxy resins, cresol triazine-type epoxy resins, tetraphenylol ethane-type epoxy resins, trisphenylol ethane-type epoxy resins, polyphenol-type epoxy resins, aliphatic epoxy resins, aromatic ester-type epoxy resins, alicyclic ester-type epoxy resins, ether ester-type epoxy resins, and the like. Glycidyl compounds of diamino diphenyl methane, diethylene triamine, diamino diphenyl sulfone, and other amino-based compounds may also be used. These epoxy resins may be used singly or as mixtures of multiple types thereof.

In the resin material of the present embodiment, no particular limitations are placed on components other than the aforementioned resin (D) in which the distance between the functional groups is greater than in a phenol novolac resin and which are selected among epoxy resin curing agents (C). Examples of such components include bisphenol A-type phenol resins, bisphenol F-type phenol resins, bisphenol S-type phenol resins, dihydroxy ethers of biphenyl isomers, naphthalene diol-type resins, phenol novolac resins, cresol novolac resins, phenol diphenyl ether aralkyl-type resins, novolac-type resins containing naphthalene, novolac-type resins containing anthracene, novolac-type resins containing fluorene, novolac-type resins containing bisphenol fluorene, novolac-type phenol resins containing bisphenol F, novolac-type phenol resins containing bisphenol A, phenol biphenyl triazine-type resins, phenol xylene triazine-type resins, phenol triazine-type resins, cresol novolac triazine-type resins, tetraphenylol ethane-type resins, trisphenylol ethane-type resins, polyphenol-type resins, aromatic ester-type phenol resins, phenol resins containing an alicyclic ester, ether ester-type phenol resins, and the like.

Besides the resins described above, diamino diphenyl methane, diethylene triamine, diamino diphenyl sulfone, and other amino-based compounds may be added as components of epoxy resin curing agent (C). It is also possible to use phenoxy resins in which one or both terminals are hydroxyl groups and which belong to the bisphenol A type, the bisphenol F type, the bisphenol S type, or a type that contains a biphenyl backbone. This phenoxy resin has a weight-average molecular weight of, for example, about 20,000 to 100,000, given in terms of the equivalent polystyrene molecular weight. These components may be contained in epoxy resin curing agent (C) as single components or mixtures of multiple types of components.

The resin material of the present embodiment may also contain an inorganic filler. However, when an inorganic filler is added, it is preferred that the mass ratio of the inorganic filler be 30 mass % or less with respect to the total quantity of reactive elastomer (A), epoxy resin (B), epoxy resin curing agent (C), and the inorganic filler in the present invention. When the mass ratio of the inorganic filler exceeds 30 mass %, the elongation at break can decrease, Young's modulus can increase, and the stress relaxation properties can become inadequate.

A known filler may be used as the inorganic filler, and examples thereof include molten silica, crystal silica, alumina, zircon, calcium silicate, calcium carbonate, potassium carbide, silicon nitride, boron nitride, beryllia, talc (talc), mica (mica), titanium oxide, zirconia, and other powders, or beads in which these materials are formed into pellets; monocrystalline fibers of calcium titanate, silicon carbide, silicon nitride, boron nitride, alumina, and the like; aluminum hydroxide, magnesium hydroxide, zinc borate, and other metal hydrates; the same metal hydrates treated on the surface with various types of organic compounds such as epoxy resins and phenol resins; magnesium hydroxide and various other types of metal hydrates in which metals are formed into solid solutions to improve anti-oxidation properties; and the like. These fillers may be used singly or as mixtures of two or more types thereof.

The resin material of the present embodiment may contain a catalyst for accelerating the curing process. The catalyst for accelerating the curing process is not subject to any particular limitation, and a catalyst commonly used for curing an epoxy resin and a curing agent may be used. Examples thereof include imidazoles, diazabicycloalkenes and derivatives thereof, tertiary amines, and the like. These catalysts for accelerating the curing process may be used singly or as mixtures of two or more types thereof.

Furthermore, silicone rubber, silicone powder, acrylonitrile butadiene rubber (NBR), indene, and other flexibility-imparting agents may be added as needed as other additives to the resin material in the present embodiment. Organosilane compounds, organotitanate compounds, organoaluminate compounds, and other coupling agents may also be added as appropriate. Among silane coupling agents, organosilane compounds, i.e., alkoxysilanes having a reactive functional group, are particularly effective at enhancing the adhesion and solder heat resistance of the resin material of the present embodiment. Specific examples of alkoxysilanes include γ-aminopropyl trimethoxysilane, N-phenyl-γ-aminopropyl triethoxysilane, and other aminosilane compounds; γ-glycidoxypropyl trimethoxysilane, γ-glycidoxypropyl methyl diethoxysilane, and other epoxy silane compounds; γ-mercaptopropyl trimethoxysilane and other mercaptosilane compounds; and γ-ureidopropyl triethoxysilane and other ureidosilane compounds.

A component used as a rust-preventing agent capable of forming a bond with a copper surface, i.e., a triazole compound, a mercapto compound other than a mercaptosilane compound, and an imidazole-copper complex may be added to the resin material of the present embodiment as an agent for improving adhesion between the resin material and a copper foil surface. The triazole compound may be 1,2,3-benzotriazole or tolyl triazole. The mercapto compound may be 2,4,6-trimercapto-s-triazine, 2-di-n-butylamino-4,6-dimercapto-s-triazine, 2-anilino-4,6-dimercapto-s-triazine, or the like. A 2-methylimidazole copper (2) complex is an example of an imidazole-copper complex. Of these, a single component may be used alone, or a mixture of two or more types of components may be used.

Flame retardants may also be added as needed to the resin material of the present embodiment. These flame retardants include halogen-based flame retardants, nitrogen-based flame retardants, phosphorus-based flame retardants, and inorganic flame retardants. Halogen-based flame retardants include brominated bisphenol A-type resins and epoxides thereof. Among nitrogen-based flame retardants, melamine, isocyanuric acid compounds, and the like can be cited as examples of addition compounds. Among nitrogen-based flame retardants, phenol triazine-type curing agents and epoxy resins are can be cited as examples of reactive compounds. Phosphorus-based flame retardants include red phosphorus, phosphates, organophosphorus compounds, and the like. Examples of inorganic-based flame retardants include the aforementioned metal hydrates, as well as zinc molybdate, zinc stannate, and compounds obtained by coating the surface of talc or silica with zinc molybdate or zinc stannate. When a halogen-based flame retardant is used, extremely good flame retardant properties are obtained when antimony oxide is jointly used.

Any known substance other than the substances described above may also be contained in the resin material of the present embodiment insofar as it does not reduce the reliability of a semiconductor device in which the resin material is used. For example, pigments, antioxidants, organic solvents, and the like may be added.

As shown in FIG. 2, the semiconductor device 1 according to the present embodiment is characterized in that a semiconductor chip 9 is mounted via a plurality of solder bumps 7 on a package board 2 in which a wiring layer 16 composed of a resin having a Young's modulus of 1 GPa or less in a temperature range of 10 to 30° C. is provided to the uppermost layer. Components other than those described above are not shown in FIG. 2.

The method for manufacturing the semiconductor device according to the present embodiment will next be described with reference to FIG. 1. First, two support substrates (not shown) composed of copper or another metal material are prepared, and the two support substrates are bonded together. An Ni layer, an Au layer, an Ni layer, and a Cu layer are then plated in this sequence on both faces of the bonded support substrates to form a multilayer film. This multilayer film is then patterned by removing the portions other than the portions where the mounting pads 5 are to be formed. A semi-cured resin film is then applied so as to embed the patterned multilayer film. This resin film is formed from an insulating material that has a Young's modulus of 1 GPa or lower in a temperature range of 10 to 30° C. and an elongation at break of 20% or higher after curing. The film is then heated and cured to form an insulating layer. Holes are then formed in the insulating layer by laser light or the like so as to reach the aforementioned multilayer film, after which the insides of the holes are filled with a metal plating film, and vias 4 are formed. A first wiring layer in which a multilayer film and vias 4 are provided inside an insulating layer is thereby formed on both surfaces of the two support substrates.

Wiring 3 is then formed on the first wiring layer so as to connect to the vias 4, and a semi-cured resin film is applied and heat-cured so as to embed the wiring 3, whereby an insulating layer is formed. The vias 4 are formed so as to be connected to the wiring 3 inside the insulating layer, and a second wiring layer is formed in which wiring 3 and vias 4 are buried in an insulating layer. A third and additional wiring layers are then formed according to the same process as the second wiring layer. After all of the wiring layers are formed, ball pads 6 are formed by chemical plating or etching on the wiring layer last to be formed. A package board 2 is thereby formed in which a plurality of wiring layers are layered on both sides of the bonded support substrates.

The two support substrates are then separated from each other. The support substrates are removed using an alkaline solution. An Ni layer of the multilayer film is then removed using an acidic solution. Mounting pads 5 are thereby formed in which an Au layer, an Ni layer, and a Cu layer are stacked in sequence. Stiffeners 11 are then bonded via the adhesive layer 15 to the surface of the package board 2 on which the mounting pads 5 are formed, and a "board with stiffeners" is created.

Solder bumps 7 are joined to the input/output pads (not shown) of the semiconductor chip 9 in a process that is separate from the manufacturing process of the "board with stiffeners," and a "chip with solder bumps" is created. The "chip with solder bumps" is then connected to the "board with stiffeners" so that the solder bumps 7 of the "chip with solder bumps" are connected to the mounting pads 5 of the "board with stiffeners." An underfill resin 10 is then filled in between and around the semiconductor chip 9 and the package board 2 so as to surround the solder bumps 7, and the underfill resin 10 is heated and cured.

A lid 12 is then bonded via the adhesive layers 13 and 14 to the upper surface of the semiconductor chip 9 and stiffeners 11, i.e., to the surface on the opposite side from the surface to which the package board 2 is bonded. BGA balls 8 are bonded to the ball pads 6 formed on the lower surface of the package board 2.

A configuration may be adopted in which only the center portion of the support substrate is removed, leaving the surrounding portion in a frame shape, and the remaining portions of the support substrate are used as the stiffeners 11. Removal of the support substrate and formation of the stiffeners 11 can thereby be performed simultaneously, and the adhesive layer 15 becomes unnecessary.

The operation of the present embodiment configured as described above will next be described. As shown in FIGS. 1 and 2, the semiconductor device 1 is mounted to a motherboard (not shown) via the BGA balls 8. The motherboard is an FR-4 board or an FR-5 board, for example, and is a glass epoxy board in which a glass cloth is dipped in an epoxy resin, for example.

Power and signals are fed to the semiconductor device 1 via the motherboard. At this time, the power and signals are fed to the semiconductor chip 9 via the following electric current pathway: BGA balls 8→ball pads 6→vias 4 and wiring 3→mounting pads 5→solder bumps 7. The semiconductor chip 9 stores, computes, and otherwise processes the signals on the basis of the received power and signals, and outputs the results. The signal output is fed to the motherboard via the following electric current pathway: solder bumps 7→mounting pads 5→control unit 4 and wiring 3→ball pads 6→BGA balls 8, and is sent to the outside via the motherboard.

Heat is generated at this time by the operation of the semiconductor chip 9. Although part of this heat is absorbed by the lid 12, the lid 12 has a limited heat capacity. Therefore, another portion of the heat is conducted to the package board 2 via the solder bumps 7, and the remainder of the heat accumulates in the semiconductor chip 9. As a result, the temperature of the semiconductor chip 9, the solder bumps 7, and the package board 2 unavoidably increases. The semiconductor chip 9 and the package board 2 therefore undergo thermal expansion, but since the coefficient of thermal expansion of the silicon that forms the substrate of the semiconductor chip 9 differs from the coefficient of thermal expansion of the resin material that forms most of the package board 2, each of these two components undergoes a different amount of thermal expansion. As a result, a shear force acts via the solder bumps 7 between the semiconductor chip 9 and the package board 2.

Since the uppermost wiring layer 16 of the package board 2 in the present embodiment is formed from a relatively soft resin material having a Young's modulus of 1 GPa or lower, the wiring layer 16 can change shape along with the thermal expansion of the semiconductor chip 9. As a result, the force acting between the semiconductor chip 9 and the package board 2 is reduced, and no large force is exerted on the solder bumps 7. The stress acting between the semiconductor chip 9 and the package board 2 is also alleviated in the same manner by the deformation of the wiring layer 16 when the semiconductor device 1 is heated or cooled by changes in the outside air temperature, and excessive force is not exerted on the solder bumps 7. As a result, the semiconductor device 1 does not warp, and the solder bumps 7 do not break.

As described above, the uppermost layer of the package board 2 in the present embodiment, i.e., the wiring layer 16 on the side of the semiconductor chip 9, is formed from a relatively soft material having a Young's modulus of 1 GPa or lower when the temperature is 10 to 30° C. Therefore, the solder bumps 7 can be prevented from being subjected to excessive force and being broken even when temperature cycles are applied to the semiconductor device 1 by the operation of the semiconductor chip 9 or changes in the outside air temperature. It is also possible to prevent thermal stress from being repeatedly applied to the solder bumps 7, and to prevent fatigue breakage of the solder bumps 7. The reliability of the connections with respect to temperature cycles in the semiconductor device 1 is therefore high. In contrast, wiring boards have been formed in the past from materials having the highest possible Young's modulus, i.e., rigid materials, in order to inhibit deformation due to thermal stress. Thermal stress was therefore concentrated in the solder bumps, and the solder bumps were broken.

Since the elongation at break is 20% or higher in the material used to form the wiring layer 16, cracking and other defects do not occur in the wiring layer 16, and the semiconductor device 1 is highly reliable even when the wiring layer 16 is deformed in conjunction with the thermal expansion of the semiconductor chip 9.

The material for forming the wiring layer 16 in the present embodiment may be a material in which the value $(A \times 100)/(A+B+C)$ is 60 mass % or higher and less than 100 mass %, where A is the content of reactive elastomer (A), B is the content of epoxy resin (B), and C is the content of epoxy resin curing agent (C). An elongation at break of 30% or higher is thereby obtained, and the reliability of the semiconductor device 1 is even further enhanced.

A second embodiment of the present invention will next be described. The semiconductor device according to the present embodiment differs from that of the previously described first embodiment in that a different material is used to form the wiring layer 16. Aspects of the configuration of the present embodiment other than those described above are the same as in the previously described first embodiment. In the present embodiment, the material for forming the wiring layer 16 has a Young's modulus of 1 GPa or lower at 10 to 30° C., and also has an elongation at break of 50% or higher.

The material for forming the wiring layer 16 in the present embodiment contains a reactive elastomer (A) capable of reacting with an epoxy resin, an epoxy resin (B), and an epoxy resin curing agent (C). Besides a phenol-based curing agent, epoxy resin curing agent (C) contains a phenol biphenylene aralkyl resin, a phenol xylene resin, or other phenol aralkyl-type resin, for example, as a resin (D) in which the distance between the functional groups is greater than in a phenol novolac resin. The value $(A \times 100)/(A+B+C)$ is 60 mass % or higher and less than 100 mass %, where A is the content of the reactive elastomer, B is the content of the epoxy resin, and C is the content of the epoxy resin curing agent.

When the value of $(A \times 100)/(A+B+C)$ is less than 60 mass %, the amount of reactive elastomer (A) for maintaining the toughness of the resin material is inadequate, and an adequate elongation at break cannot be obtained. It is therefore preferred that this value be 60 mass % or higher.

In the present embodiment, since epoxy resin curing agent (C) contains a resin (D) in which the distance between the functional groups is greater than in a phenol novolac resin, the network of the cross-linked structure formed when epoxy resin (B) is heat-cured can be enlarged by the phenol novolac resin. As a result, the reactive elastomer (A) and epoxy resin (B) can be efficiently reacted with each other, an IPN structure can be actively formed, and the stress relaxation properties of the resin material can be enhanced.

A third embodiment of the present invention will next be described. The semiconductor device according to the present embodiment differs from that of the previously described first embodiment in that a different material is used to form the wiring layer 16. Aspects of the configuration of the present embodiment other than those described above are the same as in the previously described first embodiment. In the present embodiment, the material for forming the wiring layer 16 has a Young's modulus of 1 GPa or lower at 10 to 30° C., and also has an elongation at break of 50% or higher, the same as in the previously described second embodiment. However, the composition of this material differs from that of the previously described second embodiment. Specifically, the material contains reactive elastomer (A), epoxy resin (B), and epoxy resin curing agent (C); and epoxy resin curing agent (C) contains, for example, an ethylene oxide compound (E) in addition to a phenol-based curing agent as the resin (D) in which the distance between the functional groups is greater than in a phenol novolac resin. The value $(A \times 100)/(A+B+C)$ is 60 mass % or higher and less than 100 mass %, where A is the content of reactive elastomer (A), B is the content of epoxy resin (B), and C is the content of epoxy resin curing agent (C).

In the present embodiment, since epoxy resin curing agent (C) contains, for example, an ethylene oxide compound (E), the network of the cross-linked structure formed when epoxy resin (B) is heat-cured can be enlarged by epoxy resin curing agent (C). As a result, the reactive elastomer (A) and epoxy resin (B) can be efficiently reacted with each other, an IPN structure can be actively formed, and the stress relaxation properties of the resin material can be enhanced.

A fourth embodiment of the present invention will next be described. The semiconductor device according to the present embodiment differs from that of the previously described first embodiment in that a different material is used to form the wiring layer 16. Aspects of the configuration of the present embodiment other than those described above are the same as in the previously described first embodiment. In the present embodiment, the material for forming the wiring layer 16 has a Young's modulus of 1 GPa or lower at 10 to 30° C., and also has an elongation at break of 50% or higher, the same as in the previously described second and third embodiments. However, the composition of this material differs from that of the previously described second and third embodiments. The composition of this material will be described in detail hereinafter.

The material for forming the wiring layer 16 in the present embodiment contains as essential components an epoxy resin (B) and a reactive elastomer (A) capable of reacting with an epoxy resin. The resin material may also contain an epoxy resin curing agent (C). The value (A×100)/(A+B+C) is 60 mass % or higher and less than 100 mass %, where A is the content of reactive elastomer (A), B is the content of epoxy resin (B), and C is the content of epoxy resin curing agent (C).

The value of C is sometimes zero. In this case, the value of (A×100)/(A+B) becomes 60 mass % or higher and less than 100 mass %. Furthermore, epoxy resin (B) contains an epoxy resin in which the distance between the functional groups is greater than in a phenol novolac resin. An example of such an epoxy resin is an epoxidated ethylene oxide compound (F).

When the value of (A×100)/(A+B+C) is less than 60 mass %, the amount of reactive elastomer (A) for maintaining the toughness of the resin material is inadequate, and it is sometimes impossible to obtain adequate elongation at break. It is therefore preferred that this value be 60 mass % or higher.

In the resin material of the present embodiment, the composition of reactive elastomer (A) is the same as in the previously described first through third embodiments. The resin material according to the present embodiment may or may not contain an epoxy resin curing agent (C). When the curing agent is added, a commonly used conventional epoxy resin curing agent may be used, such as a phenol-based curing agent. Components of the resin material of the present embodiment other than those described above are the same as in the previously described first embodiment.

As described above, the epoxy resin (B) in the present embodiment contains an epoxidated ethylene oxide compound (F). This epoxidated ethylene oxide compound (F) is indicated by Formula 12 below.

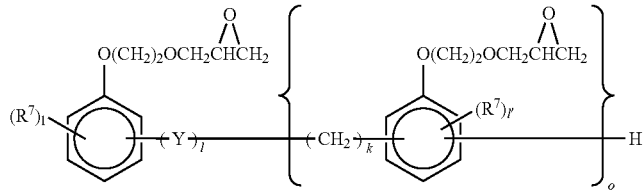

[Formula 12]

In Formula 12, $R^7$ is a $C_{1-3}$ monovalent substituent or a hydrogen atom; i is an integer from 1 to 4; i' is an integer from 1 to 3; Y is compound $Y_1$ indicated by Formula 13 below or compound $Y_2$ indicated by Formula 14 below; j is an integer from 1 to 10; and each of k and o is 1.

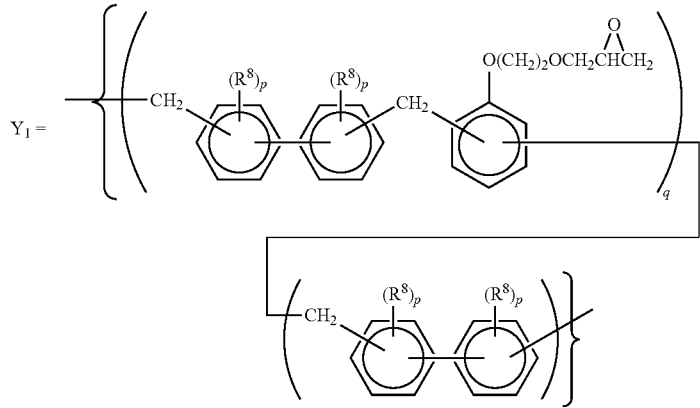

[Formula 13]

In Formula 13, $R^8$ is a $C_{1-3}$ monovalent substituent or a hydrogen atom; p is an integer from 1 to 4; and q is an integer from 0 to 9.

[Formula 14]

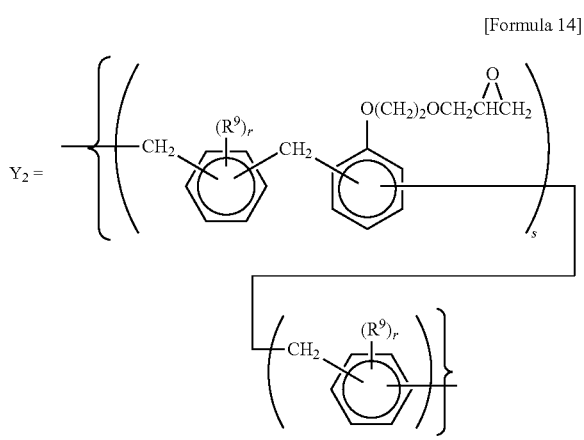

In Formula 14, $R^9$ is a $C_{1-3}$ monovalent substituent or a hydrogen atom; r is an integer from 1 to 4; and s is an integer from 0 to 9.

The effect of the fourth embodiment will next be described. In the resin material of the present embodiment, a resin in which the distance between the functional groups (epoxy groups in this case) is greater than in a phenol novolac resin is used as epoxy resin (B). It thereby becomes easier to efficiently form an IPN structure, and toughness is enhanced.

A type of resin capable of increasing the distance between cross-linkage points, such as the abovementioned epoxidated ethylene oxide compound (F), is used as the epoxy resin in which the distance between functional groups is greater than in a phenol novolac resin so as to facilitate the formation of an IPN structure. The distance between the cross-linkage points of the aforementioned epoxide (F) and the curing agent can thereby be increased, reactive elastomer (A) can be efficiently introduced into the cross-linked structure, and the effects of the interlacing of molecular chains can be enhanced even when the resin material does not contain an epoxy resin curing agent, or when a conventional epoxy resin curing agent, i.e., the abovementioned phenol-based curing agent, is used as the epoxy resin curing agent (C). As a result, an IPN structure can be efficiently formed, and a resin material can be obtained that has a low Young's modulus and high elongation at break.

In the resin material of the present embodiment thus configured, the epoxy resin (B) contains an epoxidated ethylene oxide compound (F). Therefore, an IPN structure can be efficiently formed, the Young's modulus is low, and the elongation at break is high. As a result, the reliability of connections with respect to temperature cycles can be enhanced in the semiconductor device 1, the same as in the previously described second and third embodiments. Operations and effects other than those described above in relation to the present embodiment are the same as in the previously described first through third embodiments.

A fifth embodiment of the present invention will next be described. The semiconductor device according to the present embodiment differs from that of the previously described first through fourth embodiments in that a different material is used to form the wiring layer 16. Aspects of the configuration of the present embodiment other than those described above are the same as in the previously described first embodiment. In the present embodiment, the material for forming the wiring layer 16 has a Young's modulus of 1 GPa or lower at 10 to 30° C., and has an elongation at break of 50% or higher, the same as in the previously described second through fourth embodiments. However, the composition of this material differs from that of the previously described second through fourth embodiments. The composition of this material will be described in detail hereinafter.

The material for forming the wiring layer 16 in the present embodiment contains a reactive elastomer (A) capable of reacting with an epoxy resin, an epoxy resin (B), and an epoxy resin curing agent (C). The value (A×100)/(A+B+C) is 60 mass % or higher and less than 100 mass %, where A is the content of reactive elastomer (A), B is the content of epoxy resin (B), and C is the content of epoxy resin curing agent (C). Epoxy resin (B) contains an epoxidated ethylene oxide compound (F), and epoxy resin curing agent (C) contains an ethylene oxide compound (E).

When the value of (A×100)/(A+B+C) is less than 60 mass %, the amount of reactive elastomer (A) for maintaining the toughness of the resin material is inadequate, and it is sometimes impossible to obtain adequate elongation at break. It is therefore preferred that this value be 60 mass % or higher.

In the resin material of the present embodiment, the composition of reactive elastomer (A) and the ethylene oxide (E) is the same as in the previously described third embodiment. The composition of the epoxidated ethylene oxide compound (F) is the same as in the previously described fourth embodiment. Components of the resin material of the present embodiment other than those described above are the same as in the previously described first embodiment.

The resin material in the present embodiment contains a reactive elastomer (A) capable of reacting with an epoxy resin, an epoxy resin (B), and an epoxy resin curing agent (C). The content ratio of reactive elastomer (A) with respect to the total quantity of these components is 60 mass % or higher and less than 100 mass %. Epoxy resin curing agent (C) contains an ethylene oxide compound (E), and epoxy resin (B) contains an epoxidated ethylene oxide compound (F). Therefore, a high elongation at break is achieved. Operations and effects other than those described above in relation to the present embodiment are the same as in the previously described first embodiment.

A sixth embodiment of the present invention will next be described. The semiconductor device according to the present embodiment differs from that of the previously described first through fifth embodiments in that a different material is used to form the wiring layer 16. Aspects of the configuration of the present embodiment other than those described above are the same as in the previously described first embodiment. In the present embodiment, the material for forming the wiring layer 16 has a Young's modulus of 1 GPa or lower at 10 to 30° C., and has an elongation at break of 55% or higher. The composition of this material differs from that of the previously described second through fifth embodiments. The composition of this material will be described in detail hereinafter.

The material for forming the wiring layer 16 in the present embodiment contains as essential components an epoxy resin (B) and a reactive elastomer (A) capable of reacting with an epoxy resin. The resin material may also contain an epoxy resin curing agent (C). The value (A×100)/(A+B+C) is 70 mass % or higher and less than 100 mass %, where A is the content of reactive elastomer (A), B is the content of epoxy resin (B), and C is the content of epoxy resin curing agent (C). The value of C is sometimes zero. In this case, the value of (A×100)/(A+B) becomes 70 mass % or higher and less than 100 mass %.

When the value of (A×100)/(A+B+C) is less than 70 mass %, the amount of reactive elastomer (A) for maintaining the toughness of the resin material is inadequate, and it is sometimes impossible to obtain adequate elongation at break. It is therefore preferred that this value be 70 mass % or higher.

In the resin material of the present embodiment, the composition of reactive elastomer (A) and epoxy resin (B) is the same as in the previously described first embodiment. When an epoxy resin curing agent (C) is used, the curing agent may be a conventional epoxy resin curing agent, the same as in the previously described first embodiment. Components of the resin material of the present embodiment other than those described above are the same as in the previously described first embodiment.

In the present embodiment, the mass ratio of reactive elastomer (A) {(A×100)/(A+B+C)} is set within the range of 70 mass % or higher and less than 100 mass % in the resin material essentially composed of reactive elastomer (A) and epoxy resin (B). Therefore, even without the use of a resin capable of increasing the distance between cross-linkage points, such as the aforementioned ethylene oxide compound (E) or epoxide (F), the elongation at break shows a specific increase at normal temperature (25° C., for example), and superior stress relaxation properties can be obtained. Operations and effects other than those described above in relation to the present embodiment are the same as in the previously described first embodiment.

Examples were described in the aforementioned embodiments in which only the uppermost wiring layer 16 of the package board 2 was formed from a resin having a Young's modulus of 1 GPa or less at room temperature, but the present invention is not limited by these examples, and two or more layers including the uppermost layer may be formed from the aforementioned resin having a Young's modulus of 1 GPa or less, and all of the wiring layers in the package board 2 may be formed from the resin having a Young's modulus at room temperature of 1 GPa or less. The package board 2 as a whole is thereby enabled to change shape, and the thermal-stress-relaxing effects are even further enhanced.

It is particularly preferred that not only the uppermost layer of the package board 2, but also the lowermost wiring layer of the package board 2, i.e., the wiring layer facing the motherboard (not shown) in the package board 2, by formed from a resin material having a Young's modulus of 1 GPa or less in the temperature range of 10 to 30° C. The lowermost wiring layer of the package board 2 can thereby change shape in conjunction with the thermal expansion of the motherboard, and the thermal stress placed on the BGA balls 8 can be alleviated. As a result, warping of the semiconductor device 1 and fatigue fracturing of the BGA balls 8 can be prevented, and the reliability of connections with respect to temperature cycles can be enhanced. The elongation at break of the resin material for forming the lowermost wiring layer of the package board 2 is preferably 50% or higher.

A configuration may be adopted in which the ball pads 6 and the BGA balls 8 are provided to the side of the package board 2 on which the semiconductor chip 9 is mounted, and the BGA balls 8 are connected to the motherboard.

Test Example 1

Figure 3:
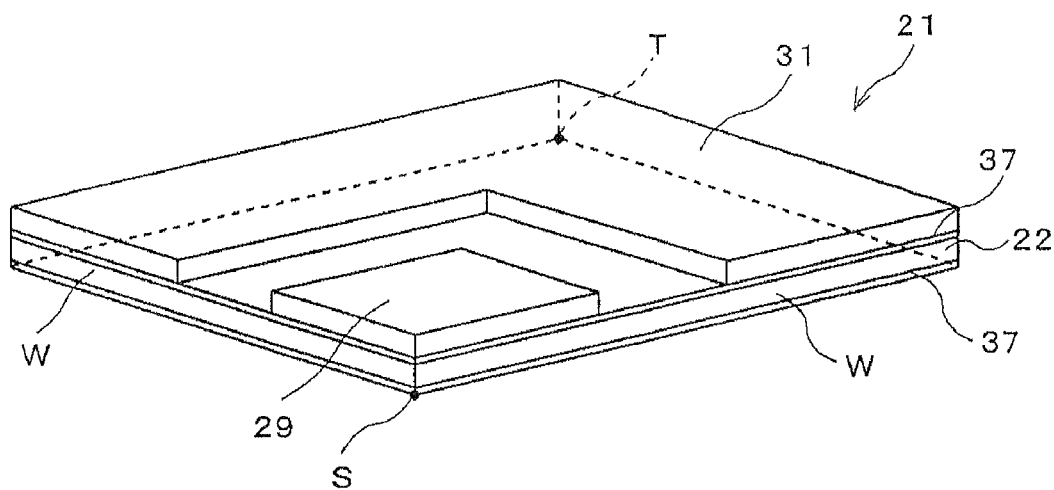
FIG. 3 is a perspective view of the semiconductor device assumed in the simulation of Test Example 1.
Figure 4:
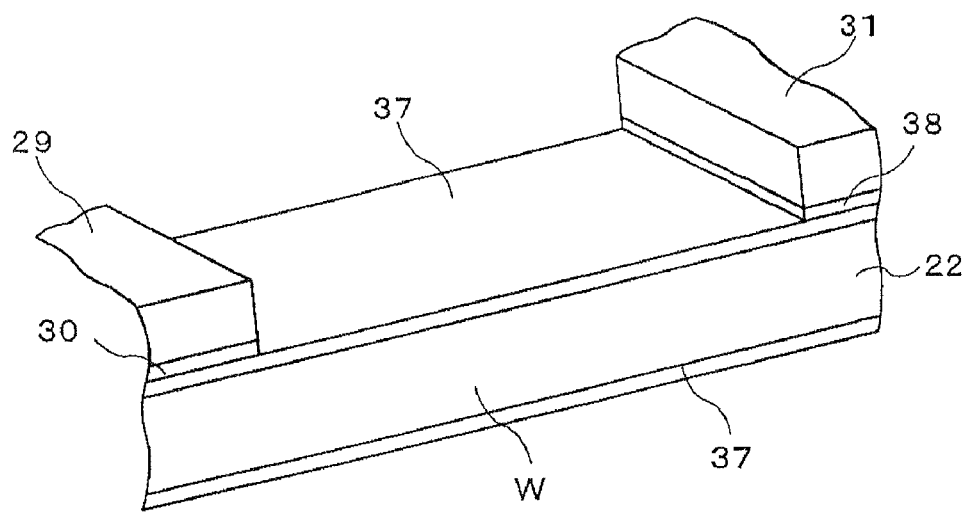
FIG. 4 is a partial enlarged view of the semiconductor device shown in FIG. 3.
Figure 5A:
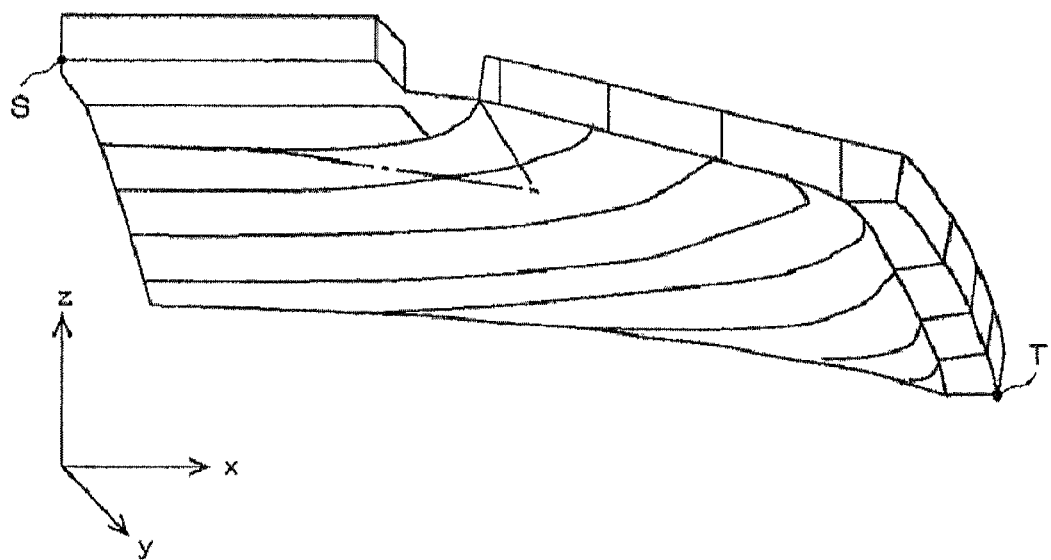
Figure 5B:
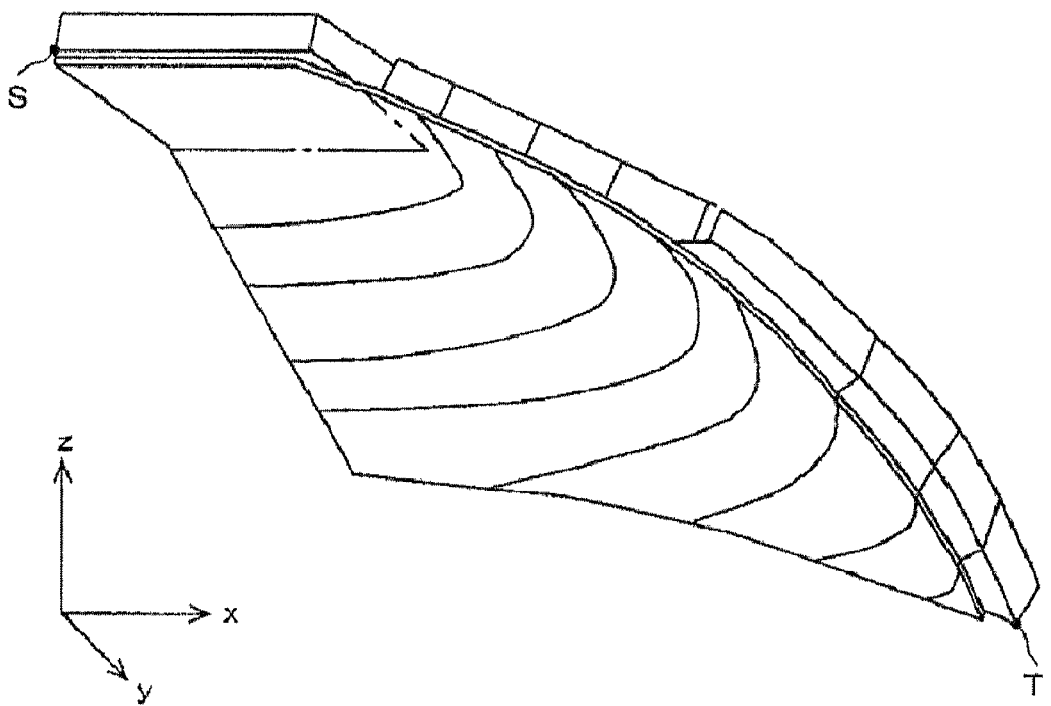

The effect of examples of the present invention will be specifically described hereinafter in comparison with examples of configurations outside the range of the claims. Test Example 1 will first be described. A semiconductor device such as the ones previously described in the first through fourth embodiments was assumed in Test Example 1, and linear thermal stress analysis was performed by simulation. FIG. 3 is a perspective view of the semiconductor device assumed in this simulation, and FIG. 4 is an enlarged view of a portion of the semiconductor device shown in FIG. 3. FIGS. 5A and 5B are perspective views showing the simulation results, wherein FIG. 5A shows the results for an example of the present invention, and FIG. 5B shows the results for a comparative example. FIGS. 3, 5A, and 5B show a (¼) portion of the entire semiconductor device.

The simulation conditions will be described hereinafter. The model used in the simulation was created using I-DEAS MasterSeries 7.0. As shown in FIGS. 3 and 4, an FCBGA-type semiconductor device 21 was assumed for the simulated semiconductor device. This semiconductor device 21 has a square shape in plan view, and is quadrilaterally symmetrical. Therefore, a (¼) model obtained by dividing the semiconductor device 21 into four parts along the plane of symmetry W was analyzed in the present simulation.

A package board 22 is provided in the semiconductor device 21 used in the simulation. The entire package board 22 is formed from a single resin. A solder resist 37 is formed on the upper and lower surfaces of the package board 22. Furthermore, a semiconductor chip 29 is mounted via the solder resist 37 to the center of the package board 22. The semiconductor chip 29 is formed entirely of silicon. An underfill resin 30 is provided between the solder resist 37 and the semiconductor chip 29. A frame-shaped stiffener 31 is provided to the periphery on the package board 22, and the semiconductor chip 29 is enclosed in the open portion of the stiffener 31. An adhesion layer 38 is provided between the stiffener 31 and the solder resist 37. The junction S shown in FIG. 3 is the intersection of two planes of symmetry with the lower surface of the package board 22, and is positioned on the center line of the semiconductor device 21. The junction T corresponds to the corner of the semiconductor device 21 in the lower surface of the package board 22. In order to reduce the number of elements in the simulation, the solder bumps 7 (see FIG. 1) and the BGA balls 8 (see FIG. 1) are not modeled. The lid 12 (see FIG. 1) is also not mounted.

The dimensions, i.e., width and thickness, of the members of the semiconductor device 21, and the mechanical characteristics of each component, i.e., Young's modulus, coefficient of linear expansion, and Poisson's ratio, are shown in Table 1. As shown in Table 1, a simulation was performed for a model of an example of the present invention and a model of a comparative example in Test Example 1. In the model of the example, the Young's modulus of the material for forming the package board 22 was set to 0.73 GPa, and the Young's modulus of the material for forming the package board 22 in the model of the comparative example was set to 3.1 GPa. ABF-GX (trade name) manufactured by Ajinomoto Fine Techno Co. was assumed to be the material of the package board 22 used in the model of the comparative example. The "width" shown in Table 1 is the length in the longitudinal and transverse directions in the (¼) model described above. In the entire semiconductor device 21, the width of each member is twice the value for the width shown in Table 1.

TABLE 1

| Member | | Dimensions | | Mechanical Characteristics | | |
|---|---|---|---|---|---|---|
| | | | | Young's | Coefficient of Linear | |
| | | | Thickness | Modulus | Expansion | Poisson's |
| Number | Name | Width | (mm) | (GPa) | (ppm/K) | Ratio |
| Example 22 | Package board | 25 | 0.8 | 0.73 | 110 | 0.36 |
| Comparative Example | | | | 3.1 | 68 | 0.35 |
| In Common 37 | Solder resist | 25 | 0.02 | 2 | 63 | 0.3 |
| 29 | Semiconductor chip | 9 | 0.7 | 170 | 3 | 0.4 |
| 30 | Underfill resin | 9 | 0.08 | 7 | 30 | 0.3 |
| 31 | Stiffeners Outside edge | 25 | 0.7 | 118 | 18 | 0.3 |
| | Inside edge | 14 | | | | |
| 38 | Adhesion layer Outside edge | 25 | 0.1 | 0.03 | 500 | 0.2 |
| | Inside edge | 14 | | | | |

Linear thermal stress analysis was performed by ANSYS 5.6 using a model such as the one described above. The stress of each part was assumed to be 0 at the temperature of 220° C., which is the melting point of solder balls for flip-chip mounting. The amount of warping at room temperature (25° C.) was calculated, and the examples and comparative examples were compared with each other. Considering that the resin does not cure at the temperature of 220° C., but cures at a lower temperature than 220° C., the stress was assumed to be 0 at 175° C. for the underfill resin 30 and 150° C. for the stiffener 31 and adhesion layer 38. Changes in the position of the junction on the plane of symmetry were confined to the direction perpendicular to the plane of symmetry. Furthermore, changes in the position of junction S, i.e., the junction on the lower surface of the package board 22 on the line that intersects the plane of symmetry, were restricted in all directions, and the position of junction S was fixed.

Results from this type of simulation are shown in FIGS. 5A and 5B and Table 2. In FIGS. 5A and 5B, x, y, and z indicate rectangular coordinates, the x direction and the y direction are parallel to the upper surface of the package board 22 when the temperature is 220° C., and the z direction is perpendicular to this upper surface. In FIGS. 5A and 5B, additional lines are shown in order to make the three-dimensional shape easier to recognize. Table 2 shows the amount of warping at the corners of the open portion of the stiffener (specifically, the open portion of the stiffener 31), and the amount of warping at the corner (specifically, junction T) of the package board. The amount of warping is the amount of displacement in the z direction.

TABLE 2

| | Amount of Warping (μm) | |
|---|---|---|
| | Open portion of stiffener | Corner of package board |
| Example | 47.4 | 175 |
| Comparative Example | 86.2 | 311 |

As shown in FIGS. 5A and 5B and Table 2, the amount of warping in the example of the present invention was small in comparison with the comparative example. This indicates that the thermal stress applied to the semiconductor device 21 in the example was small in comparison with the comparative example. It is apparent from these results that the stability of connections with respect to temperature cycles in the semiconductor device of the example of the present invention is superior to that of the semiconductor device of the comparative example.

Test Example 2

Test Example 2 will next be described. In Test Example 2, the resin material described in the above-mentioned embodiments was actually fabricated; a laminate film, a double-sided copper-clad sheet, and an FCBGA-type semiconductor device were fabricated using the aforementioned resin material; and the characteristics thereof were evaluated. The components for forming the resin material according to the example and comparative example will first be described. These components are shown in Table 3, and specifically include a reactive elastomer (A), an epoxy resin (B), an epoxy resin curing agent (C), a resin (D) in which the distance between the functional groups is greater than in a phenol novolac resin, an ethylene oxide compound (E), and an epoxidated ethylene oxide compound (F).

TABLE 3

| Component | | Type | | Molecular weight (Mw) | Hydroxyl Equivalent (g/eq) | Epoxy Equivalent (g/eq) |
|---|---|---|---|---|---|---|
| Ref | Name of Substance | Ref | Name of Substance | | | |
| A | Reactive elastomer | A1 | Reactive polyamide elastomer | 60000 | 5000 | — |
| | | A2 | Reactive polyamide elastomer | 20000 | 5000 | — |

TABLE 3-continued

| Component | | Type | | Molecular weight (Mw) | Hydroxyl Equivalent (g/eq) | Epoxy Equivalent (g/eq) |
|---|---|---|---|---|---|---|
| Ref | Name of Substance | Ref | Name of Substance | | | |
| B | Epoxy resin | B1 | Phenol biphenylene aralkyl epoxy resin | 1780 | — | 274 |
| | | B2 | Phenol xylylene epoxy resin | 1560 | — | 240 |
| | | B3 | Phenol novolac epoxy resin | 1170 | — | 180 |
| C | Epoxy resin curing agent | C1 | p-cresol novolac resin | 1200 | 118 | — |
| | | C2 | Phenol novolac resin | 680 | 105 | — |
| D | Resin having long distance between functional groups | D1 | Phenol biphenylene aralkyl resin | 1400 | 215 | — |
| | | D2 | Phenol xylylene resin | 1100 | 169 | — |
| E | Ethylene oxide (EO) compound | E1 | Phenol biphenylene aralkyl-type EO resin | 1690 | 260 | — |
| | | E2 | Phenol xylylene-type EO resin | 1390 | 214 | — |
| | | E3 | Phenol novolac-type EO resin | 975 | 150 | — |
| F | Epoxide of EO compound | F1 | Epoxidated phenol biphenylene aralkyl-type EO resin | 2260 | — | 348 |
| | | F2 | Epoxidated phenol xylylene-type EO resin | 1960 | — | 302 |
| | | F3 | Epoxidated phenol novolac-type EO resin | 1540 | — | 237 |

The reactive polyamide elastomer (A1) or (A2) shown in Table 3 was used as reactive elastomer (A). The structures of reactive polyamide elastomers (A1) and (A2) can be indicated by Formula 15 below. In Formula 15 below, each of x, y, z, l, m, and n is an average degree of polymerization, wherein x is an integer from 3 to 7, y is an integer from 1 to 4, z is an integer from 5 to 15, n=l+m, n is an integer from 2 to 20, and m/(l+m)≧0.04.

The phenol biphenylene aralkyl epoxy resin (B1), phenol xylene epoxy resin (B2), or phenol novolac epoxy resin (B3) shown in Table 3 was used as epoxy resin (B). The structure of the phenol biphenylene aralkyl epoxy resin (B1) can be indicated by Formula 16 below, the structure of phenol xylene epoxy resin (B2) can be indicated by Formula 17 below, and the structure of the phenol novolac epoxy resin (B3) can be indicated by Formula 18 below. In Formulae-16 through 18, n is an integer from 0 to 75.

[Formula 15]

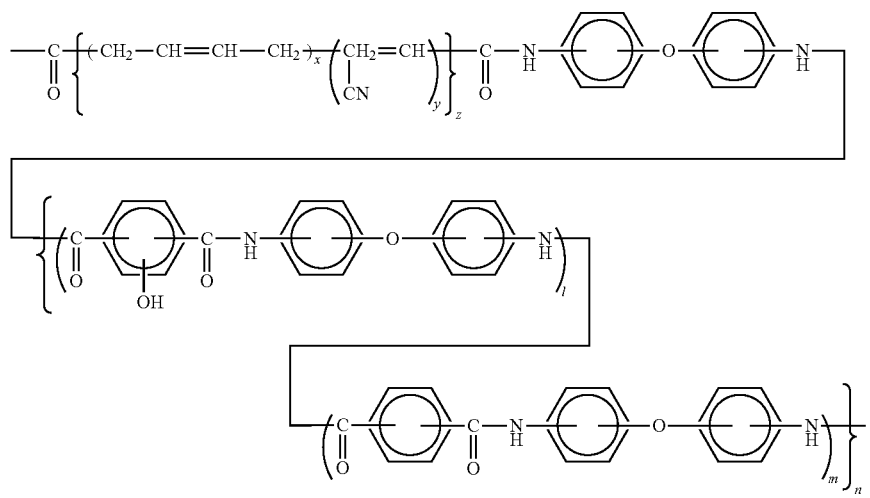

[Formula 16]

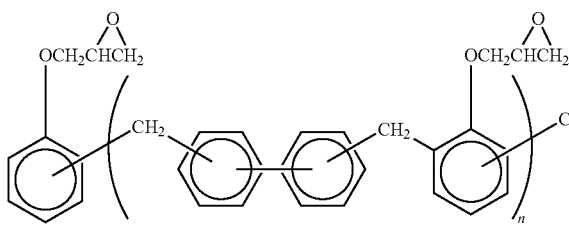

[Formula 17]

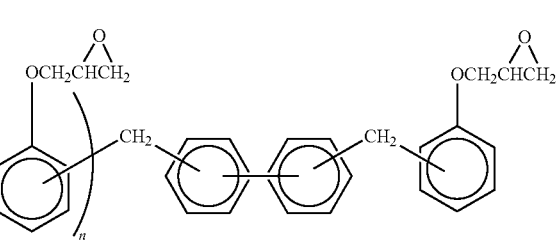

[Formula 18]

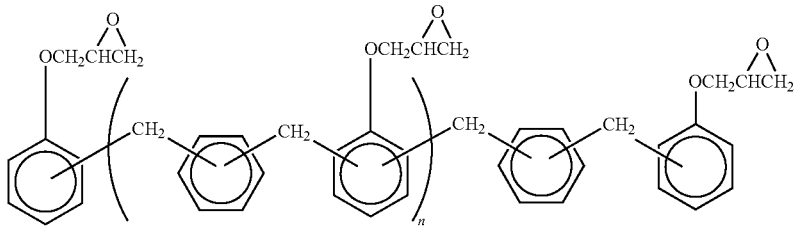

Furthermore, the p-cresol novolac resin (C1) or phenol novolac resin (C2) shown in Table 3 was used as epoxy resin curing agent (C). The structure of p-cresol novolac resin (C1) can be indicated by Formula 19 below, and the structure of phenol novolac resin (C2) can be indicated by Formula 20 below. In Formulae 19 and 20, n is an integer from 0 to 75.

[Formula 19]

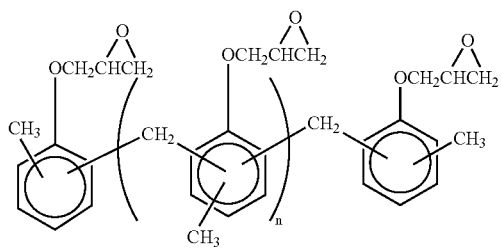

-continued

[Formula 20]

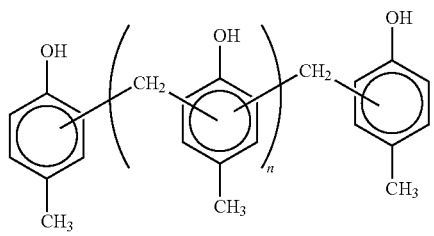

Furthermore, the phenol biphenylene aralkyl resin (D1) or phenol xylylene resin (D2) shown in Table 1 was used as the resin (D) in which the distance between the functional groups is larger than in a phenol novolac resin. The structure of phenol biphenylene aralkyl resin (D1) can be indicated by Formula 21 below, and the structure of phenol xylylene resin (D2) can be indicated by Formula 22 below. In Formulae 21 and 22, n is an integer from 0 to 75.

[Formula 21]

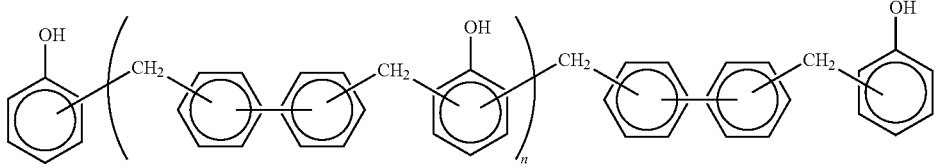

[Formula 22]

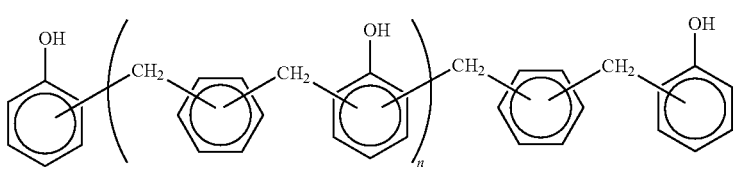

The phenol biphenylene aralkyl-type ethylene oxide (EO) resin (E1), phenol xylylene-type ethylene oxide resin (E2), or phenol novolac-type ethylene oxide resin (E3) shown in Table 3 was used as the ethylene oxide compound (E). The structure of phenol biphenylene aralkyl-type EO resin (E1) can be indicated by Formula 23 below, the structure of phenol xylylene-type EO resin (E2) can be indicated by Formula 24 below, and the structure of phenol novolac-type EO resin (E3) can be indicated by Formula 25 below. In Formulae 23 through 25, n is an integer from 0 to 75.

phenol novolac-type ethylene oxide compound (F3) shown in Table 3 was used as the epoxidated ethylene oxide compound (F). The structure of epoxide (F1) can be indicated by Formula 26 below, the structure of epoxide (F2) can be indicated by Formula 27 below, and the structure of epoxide (F3) can be indicated by Formula 28 below. In Formulae 26 through 28, n is an integer from 0 to 75, and G is the glycidyl group indicated by Formula 29 below.

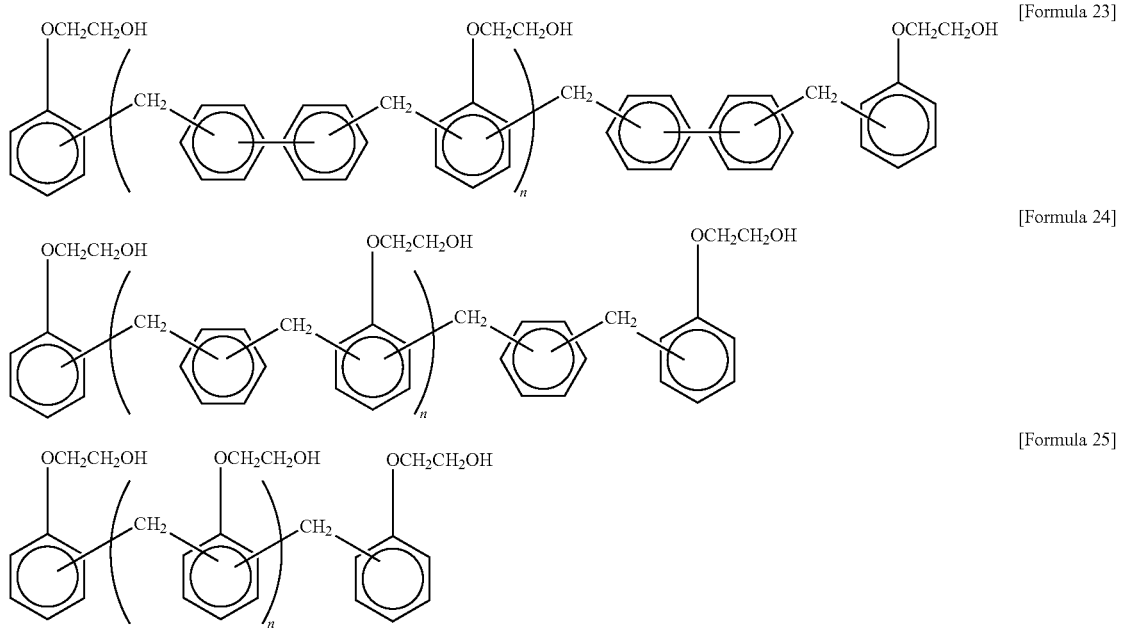

Furthermore, the epoxidated phenol biphenylene aralkyl-type ethylene oxide compound (F1), epoxidated phenol xylylene-type ethylene oxide compound (F2), or epoxidated

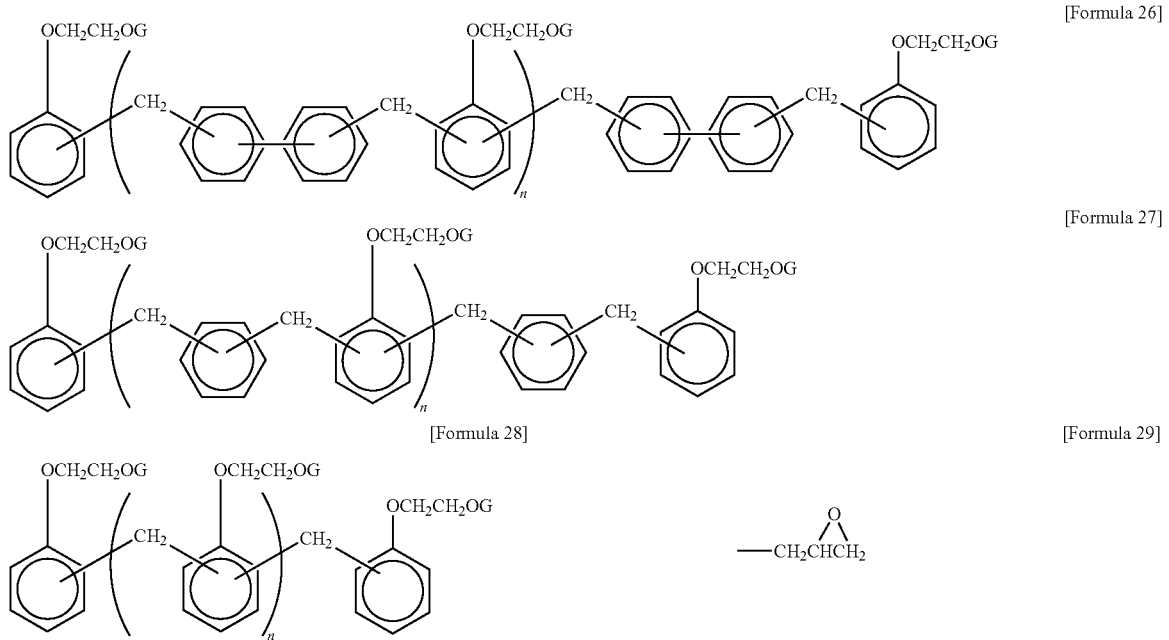

The resin material containing the components described above was dissolved or dispersed in an organic solvent together with a curing-promoting catalyst, and a varnish solution was created. Table 4 shows the types of curing-promoting catalyst and organic solvent used, as well as the copper foil used in the process described hereinafter.

TABLE 4

| Material | Type |
|---|---|
| Curing-promoting Catalyst | Imidazole-based catalyst "1B2PZ" manufactured by Shikoku Chemicals Corporation |
| Solvent | Cyclopentanone manufactured by Zeon Corporation<br>Methyl ethyl ketone (MEK) manufactured by Kanto Kagaku |
| Copper Foil | Low-profile electrolyte copper foil "USLP" (thickness: 12 μm) manufactured by Nippon Denkai |

A laminate film, a one-sided copper-clad prepreg, and a double-sided copper-clad sheet were created using the varnish solution. An FCBGA-type semiconductor device was created using the one-sided copper-clad prepreg. The method for fabricating these samples will be described hereinafter.

(1) Fabrication of Laminate Film

A coating of the abovementioned varnish solution was uniformly applied by a coating machine so as to give the desired thickness on a polyethylene terephthalate (PET) film coated with a release agent. The product was then dried for five minutes at a temperature of 100° C. to evaporate a certain amount of the solvent, after which the resin surface was covered with a PET film treated with a release agent to create a laminate film having a three-layer structure. Specifically a laminate film composed of a release PET layer, a resin layer and a release PET layer was created. The resin layer (also including residual solvent) in this laminate film was in an uncured state.

(2) Fabrication of One-Sided Copper-Clad Prepreg

The abovementioned varnish solution was uniformly applied by a coating machine so as to give the desired thickness on the rough surface (also referred to as matte surface) of the copper foil shown in Table 4. The product was then dried for five minutes at a temperature of 100° C. to evaporate a certain amount of the solvent, after which the resin surface was covered with a PET film treated with a release agent to create a one-sided copper-clad prepreg whose three-layer structure had a release PET, a resin portion and copper foil. The resin layer (including residual solvent) in the prepreg was in an uncured state.

(3) Fabrication of Double-Sided Copper-Clad Sheet

The abovementioned varnish solution was uniformly applied by a coating machine so as to give the desired thickness on the rough surface (matte surface) of the copper foil shown in Table 4. The product was then dried for five minutes at a temperature of 100° C. to evaporate a certain amount of the solvent. One more sheet of the copper foil shown in Table 4 was then prepared, and the additional copper foil was placed so that the rough foil surface touched the resin surface of the sample (copper foil-resin layer) obtained by applying the varnish solution to a copper foil and drying. The laminate was press-molded by applying a pressure of 3 MPa to the laminate for one hour at a temperature of 160° C., and then allowing the product to stand for two hours at a temperature of 180° C. with no pressure applied. A double-sided copper-clad sheet (copper foil-resin layer-copper foil) was thereby created. The resin layer (including residual solvent) in this double-sided copper-clad sheet was in a cured state.

(4) Fabrication of FCBGA-Type Semiconductor Device

The FCBGA-type semiconductor device shown in FIG. 1 was fabricated using the resin material of the example and comparative example described above. Specifically, wiring was formed in the copper foil of the one-sided copper-clad prepreg described in (2), the one-sided copper-clad prepreg was layered in a plurality of layers by a buildup process, and a package board was created. A semiconductor chip was mounted to this package board, a frame-shaped stiffener was provided on the periphery of the semiconductor chip, and a lid (heat sink) was affixed on the semiconductor chip and a reinforcing panel.

The elongation at break of the resin material, the circuit embedding properties, and the reliability with respect to temperature cycles were evaluated using as samples the laminate film, one-sided-copper-clad prepreg, double-sided copper-clad sheet, and FCBGA-type semiconductor device fabricated as described above. The evaluation methods will be described hereinafter.

(5) Evaluation of Toughness

The abovementioned laminate film was press-molded by applying a pressure of 3 MPa for one hour at a temperature of 160° C., and then allowing the product to stand for two hours at a temperature of 180° C. with no pressure applied, and a cured film for tensile testing having a thickness of 50 Mm was obtained. This cured film was cut into a strip 10 mm wide and 80 mm long, and tensile testing was performed. The tensile testing conditions were set so that the distance between the supports for supporting the cured film was 60 mm, and the pulling speed was 5 mm/minute. The Young's modulus and the elongation at break were computed from this tensile testing.

(6) Evaluation of Circuit Embedding Properties

The release PET was peeled from one side of the laminate film (release PET layer-resin layer-release PET layer) of (1) to expose the resin layer. A conventional three-layer CCL, i.e., a conventional three-layer CCL whose three-layer structure had a PEN layer, a resin layer (ABF-GX (trade name) manufactured by Ajinomoto Fine Techno Co.), and a copper foil was prepared; and a line-and-space pattern in the form of a copper wiring circuit was formed on the surface of the copper foil. The lines and spaces of this pattern each had a width of 100 μm. A three-layer CCL copper foil surface was superposed on the resin surface of the laminate film, and a mirror wafer was also placed on the three-layer CCL.

A sample was thereby created in which a release PET layer, a resin layer (resin layer of example or comparative example), a copper foil, a conventional resin layer, a PEN layer, and mirror wafer were sequentially arranged in layers. A pressure of 1 MPa was applied to this sample for 30 minutes at a temperature of 180° C. using a vacuum laminator to join together the resin surface of the laminate film and the patterned copper foil. This sample was then observed with a microscope to determine the degree to which the pattern of the copper foil was embedded in the resin layer, and the condition of embedding properties of the circuit was determined. Cases in which the circuit embedding properties were particularly good were designated as ☐, and cases in which the embedding properties were sufficiently good for practical use were designated as ☐.

(7) Evaluation of Reliability with Respect to Temperature Cycles

Thirty-eight of the FCBGA-type semiconductor device created in (4) were prepared for the resin materials, and temperature cycle testing was performed for these semiconductor devices. One cycle of temperature cycle testing consisted of starting at room temperature, cooling the sample to −40° C. and maintaining a temperature of −40° C. for 15 minutes, and then heating the sample to 125° C. and maintaining a temperature of 125° C. for 15 minutes. A constant time of 15 minutes was used for heating and cooling. For 1,000 cycles of temperature cycle testing, cases in which cracking occurred in the joints (solder bumps) between the semiconductor chip and the package board constituting the FCBGA-type semiconductor device were designated as defects, and the number of times (defect occurrence rate) that this defect occurred was used to indicate the reliability of the connections. An FCBGA-type semiconductor device with a lower defect occurrence rate can be considered to have superior temperature cycle reliability.

The composition and the evaluation results of the resin materials according to the examples and comparative examples are shown in Tables 5 and 10. For example, in No. 1 shown in Table 5, a mixture obtained by adding 0.05 mass % of an imidazole as a curing-promoting catalyst to a resin material containing 60 mass % of polyamide elastomer (A1) as reactive elastomer (A), 23.86 mass % of epoxy resin (B1) as epoxy resin (B), and 16.14 mass % of epoxy resin curing agent (D1) as epoxy resin curing agent (C) was dissolved or dispersed in an organic solvent (solvent mixture of 78 mass % of cyclopentanone and 22 mass % of methyl ethyl ketone (MEK)) to prepare a varnish solution containing 30 mass % of non-volatile components (total quantity of components other than the abovementioned organic solvent). Using the varnish solution thus obtained, the various types of evaluation samples described in (1) through (4) above were created, and the performance of each sample was evaluated according to the evaluation methods described in (5) through (7) above. Samples other than the one used in No. 1 were fabricated and evaluated according to the same method as No. 1, except that resin materials having the compositions shown in Tables 5 through 10 were used.

In the tables, "phr" is an abbreviation for "per hundred resin," and indicates the mass ratio (mass %) of the curing-promoting catalyst when the mass of the resin is 100. The "connection reliability" field indicates the number of semiconductor devices in which defects occurred among the 38 FCBGA-type semiconductor devices for each sample when the temperature cycle test described in (7) was performed. Components for which there is an empty field in Tables 5 through 10 were not added to the resin material.

TABLE 5

| No. | 1 Ex. | 2 Ex. | 3 Ex. | 4 Ex. | 5 Ex. | 6 Ex. | 7 Ex. |
|---|---|---|---|---|---|---|---|
| Polyamide elastomer A1 | 60 | 70 | 80 | 90 | 50 | 50 | 55 |
| Polyamide elastomer A2 | | | | | | | |
| Epoxy resin B1 | 23.86 | 18.5 | 13.13 | 7.77 | 36.91 | 29.22 | 33.27 |
| Epoxy resin B2 | | | | | | | |
| Epoxy resin B3 | | | | | | | |
| Epoxy resin curing agent C1 | | | | | | | |
| Epoxy resin curing agent C2 | | | | | 13.09 | | 11.63 |
| Epoxy resin curing agent D1 | 16.14 | 11.50 | 6.87 | 2.23 | | 20.78 | |
| Epoxy resin curing agent D2 | | | | | | | |
| Ethylene oxide compound E1 | | | | | | | |
| Ethylene oxide compound E2 | | | | | | | |
| Ethylene oxide compound E3 | | | | | | | |
| Epoxide F1 | | | | | | | |
| Epoxide F2 | | | | | | | |
| Epoxide F3 | | | | | | | |
| Curing-promoting catalyst (phr) | 0.05 | 0.05 | 0.05 | 0.05 | 0.05 | 0.05 | 0.05 |
| Toughness Elongation at break (%) | 52 | 68 | 85 | 95 | 20 | 25 | 27 |
| Young's modulus (GPa) | 0.83 | 0.75 | 0.61 | 0.54 | 0.93 | 0.91 | 0.90 |
| Circuit embedding properties | ◎ | ◎ | ○ | ○ | ◎ | ◎ | ◎ |
| Connection reliability | 1/38 | 0/38 | 0/38 | 0/38 | 5/38 | 5/38 | 5/38 |

Ex. denotes Example.

TABLE 6

| No. | 1 Ex. | 8 Ex. | 9 Ex. |
|---|---|---|---|
| Polyamide elastomer A1 | 60 | 60 | 60 |
| Polyamide elastomer A2 | | | |
| Epoxy resin B1 | 23.86 | 25.99 | 29.83 |
| Epoxy resin B2 | | | |
| Epoxy resin B3 | | | |
| Epoxy resin curing agent C1 | | | |
| Epoxy resin curing agent C2 | | | 10.17 |
| Epoxy resin curing agent D1 | 16.14 | | |
| Epoxy resin curing agent D2 | | 14.01 | |
| Ethylene oxide compound E1 | | | |
| Ethylene oxide compound E2 | | | |
| Ethylene oxide compound E3 | | | |
| Epoxide F1 | | | |
| Epoxide F2 | | | |
| Epoxide F3 | | | |
| Curing-promoting catalyst (phr) | 0.05 | 0.05 | 0.05 |
| Toughness Elongation at break (%) | 52 | 50 | 32 |
| Young's modulus (GPa) | 0.83 | 0.85 | 0.88 |
| Circuit embedding properties | ◎ | ◎ | ◎ |
| Connection reliability | 1/38 | 2/38 | 4/38 |

TABLE 7

| No | 10 Ex. | 11 Ex. | 12 Ex. | 5 Ex. | 7 Ex. | 9 Ex. |
|---|---|---|---|---|---|---|
| Polyamide elastomer A1 | 60 | 60 | 60 | 50 | 55 | 60 |
| Polyamide elastomer A2 | | | | | | |
| Epoxy resin B1 | 22.13 | 23.9 | 27.01 | 36.92 | 33.37 | 29.83 |
| Epoxy resin B2 | | | | | | |
| Epoxy resin B3 | | | | | | |
| Epoxy resin curing agent C1 | | | | | | |
| Epoxy resin curing agent C2 | | | | 13.09 | 11.63 | 10.17 |
| Epoxy resin curing agent D1 | | | | | | |
| Epoxy resin curing agent D2 | | | | | | |
| Ethylene oxide compound E1 | 17.87 | | | | | |
| Ethylene oxide compound E2 | | 16.10 | | | | |
| Ethylene oxide compound E3 | | | 12.99 | | | |
| Epoxide F1 | | | | | | |
| Epoxide F2 | | | | | | |
| Epoxide F3 | | | | | | |
| Curing-promoting catalyst (phr) | 0.05 | 0.05 | 0.05 | 0.05 | 0.05 | 0.05 |

TABLE 7-continued

| No | | 10 Ex. | 11 Ex. | 12 Ex. | 5 Ex. | 7 Ex. | 9 Ex. |
|---|---|---|---|---|---|---|---|
| Toughness | Elongation at break (%) | 65 | 62 | 55 | 20 | 27 | 32 |
| | Young's modulus (GPa) | 0.76 | 0.78 | 0.82 | 0.93 | 0.90 | 0.88 |
| Circuit embedding properties | | ⊚ | ⊚ | ⊚ | ⊚ | ⊚ | ⊚ |
| Connection reliability | | 1/38 | 1/38 | 1/38 | 5/38 | 5/38 | 4/38 |

TABLE 8

| No. | | 13 Ex. | 14 Ex. | 15 Ex. | 16 Ex. | 17 Ex. | 9 Ex. |
|---|---|---|---|---|---|---|---|
| Polyamide elastomer A1 | | 60 | 60 | 60 | 60 | 60 | 60 |
| Polyamide elastomer A2 | | | | | | | |
| Epoxy resin B1 | | | | | | | 29.83 |
| Epoxy resin B2 | | | | | | | |
| Epoxy resin B3 | | | | | | | |
| Epoxy resin curing agent C1 | | | | | | | |
| Epoxy resin curing agent C2 | | | | | 8.30 | | 10.17 |
| Epoxy resin curing agent D1 | | 13.68 | 15.13 | 17.67 | | | |
| Epoxy resin curing agent D2 | | | | | | | |
| Ethylene oxide compound E1 | | | | | | 15.32 | |
| Ethylene oxide compound E2 | | | | | | | |
| Ethylene oxide compound E3 | | | | | | | |
| Epoxide F1 | | 26.32 | | | 31.70 | 24.68 | |
| Epoxide F2 | | | 24.87 | | | | |
| Epoxide F3 | | | | 22.33 | | | |
| Curing-promoting catalyst (phr) | | 0.05 | 0.05 | 0.05 | 0.05 | 0.05 | 0.05 |
| Toughness | Elongation at break | 70 | 63 | 60 | 58 | 72 | 32 |
| | Young's modulus (GPa) | 0.74 | 0.77 | 0.79 | 0.80 | 0.73 | 0.88 |
| Circuit embedding properties | | ⊚ | ⊚ | ⊚ | ⊚ | ⊚ | ⊚ |
| Connection reliability | | 0/38 | 1/38 | 1/38 | 1/38 | 0/38 | 4/38 |

TABLE 9

| No. | | 18 Ex. | 19 Ex. | 20 Ex. | 21 Ex. | 22 Ex. | 5 Ex. | 23 Ex. |
|---|---|---|---|---|---|---|---|---|
| Polyamide elastomer A1 | | 75 | 75 | | | | 50 | 70 |
| Polyamide elastomer A2 | | | | 75 | 85 | 94.8 | | |
| Epoxy resin B1 | | 18.71 | 19.21 | 18.71 | 18.88 | 5.20 | 36.91 | 22.00 |
| Epoxy resin B2 | | | | | | | | |
| Epoxy resin B3 | | | | | | | | |
| Epoxy resin curing agent C1 | | 6.29 | | 6.29 | 6.12 | | | |
| Epoxy resin curing agent C2 | | | 5.79 | | | | 13.09 | 8.00 |
| Epoxy resin curing agent D1 | | | | | | | | |
| Epoxy resin curing agent D2 | | | | | | | | |
| Ethylene oxide compound E1 | | | | | | | | |
| Ethylene oxide compound E2 | | | | | | | | |
| Ethylene oxide compound E3 | | | | | | | | |
| Epoxide F1 | | | | | | | | |
| Epoxide F2 | | | | | | | | |
| Epoxide F3 | | | | | | | | |
| Curing-promoting catalyst (phr) | | 0.05 | 0.05 | 0.05 | 0.05 | 0.05 | 0.05 | 0.05 |
| Toughness | Elongation at break (%) | 87 | 83 | 85 | 90 | 100 | 20 | 56 |
| | Young's modulus (GPa) | 0.62 | 0.65 | 0.64 | 0.59 | 0.50 | 0.93 | 0.81 |
| Circuit embedding properties | | ○ | ○ | ⊚ | ○ | ○ | ⊚ | ⊚ |
| Connection reliability | | 0/38 | 0/38 | 0/38 | 0/38 | 0/38 | 5/38 | 1/38 |

TABLE 10

| No. | | 19 Ex. | 24 Ex. | 25 Ex. | 5 Ex. | 26 Com. Ex. | 23 Ex. |
|---|---|---|---|---|---|---|---|
| Polyamide elastomer A1 | | 75 | 75 | 75 | 50 | 25 | 70 |
| Polyamide elastomer A2 | | | | | | | |
| Epoxy resin B1 | | 19.21 | | | 36.91 | 54.60 | 22.00 |
| Epoxy resin B2 | | | 18.49 | | | | |
| Epoxy resin B3 | | | | 16.78 | | | |
| Epoxy resin curing agent C1 | | | | | | | |
| Epoxy resin curing agent C2 | | 5.76 | 6.51 | 8.22 | 13.09 | 20.40 | 8.00 |
| Epoxy resin curing agent D1 | | | | | | | |
| Epoxy resin curing agent D2 | | | | | | | |
| Ethylene oxide compound E1 | | | | | | | |
| Ethylene oxide compound E2 | | | | | | | |
| Ethylene oxide compound E3 | | | | | | | |
| Epoxide F1 | | | | | | | |
| Epoxide F2 | | | | | | | |
| Epoxide F3 | | | | | | | |
| Curing-promoting catalyst (phr) | | 0.05 | 0.05 | 0.05 | 0.05 | 0.05 | 0.05 |
| Toughness | Elongation at break (%) | 83 | 78 | 75 | 20 | 11 | 56 |
| | Young's modulus (GPa) | 0.65 | 0.70 | 0.71 | 0.93 | 1.70 | 0.81 |
| Circuit embedding properties | | ○ | ○ | ○ | ⊚ | ⊚ | ⊚ |
| Connection reliability | | 0/38 | 0/38 | 0/38 | 5/38 | 10/38 | 1/38 |

Com.Ex. denotes Comparative Example.

No. 1 through No. 25 shown in Tables 5 through 10 are examples of the present invention, and No. 26 shown in Table 10 is a comparative example. Since all of the wiring layers of the package board in examples No. 1 through No. 25 were formed from a resin material having a Young's modulus of 1 GPa or less at 10 to 30° C., the number of semiconductor devices in which defects occurred after the aforementioned temperature cycle testing was 5 or less among the 38 semiconductor devices. Since the conditions set for the aforementioned temperature cycle testing were considerably more severe than conditions that occur in practical use, the presence of five defective units among the 38 subjected to this test does not indicate a problem in practical use. In contrast, in comparative example No. 26, since the wiring layers of the package board were formed from a resin material having a Young's modulus of 1.70 GPa at room temperature, defects occurred in 10 out of 38 semiconductor devices as a result of the aforementioned temperature cycle testing. The semiconductor devices according to examples No. 1 through No. 25 thus had superior reliability of connections with respect to temperature cycles in comparison with the semiconductor device according to comparative example No. 26.

The elongation at break of the resin material was 50% or higher in examples No. 1 through No. 4, example No. 8, and example No. 10 through No. 25. Therefore, the defects occurred after temperature cycle testing in 2 or fewer semiconductor devices out of the 38, and the reliability of connections with respect to temperature cycles was particularly good in comparison with examples No. 5 through No. 7, and example No. 9. In contrast, since the elongation at break of the resin material was less than 50% in examples No. 5 through No. 7, and example No. 9, defects occurred after temperature cycle testing in 4 to 5 semiconductor devices out of the 38, and although the connection reliability was better than in comparative example No. 26, the connection reliability was inferior to that of examples No. 1 through No. 4 and examples No. 10 through No. 25.

The circuit embedding properties were good in all of examples No. 1 through No. 25. Among these examples, the circuit embedding properties were particularly good in examples No. 1 and No. 2, examples No. 5 through No. 17, example No. 20, and example No. 23. As is clear by comparing example No. 18 with example No. 20 shown in Table 9, the circuit embedding properties were superior when polyamide elastomer A2 having a lower molecular weight was used (example No. 20) in comparison with when polyamide elastomer A1 was used (example No. 18).

Test Example 3

Test Example 3 will next be described. In Test Example 3, a commercially available resin material was used as the material for forming the package board, and semiconductor devices were fabricated and subjected to temperature cycle testing according to the same methods as were used in Test Example 2. The results thereof are shown in Table 11.

TABLE 11

| No. | 31 Comparative Example | 32 Comparative Example |
|---|---|---|
| Trade name | Manufactured by Ajinomoto Fine Techno ABF-GX | Manufactured by Ube Industries UPISEL-N |
| Resin type | Epoxy resin | Polyimide resin |
| Elongation at break (%) | 12 | 78 |
| Young's modulus (GPa) | 3.1 | 7.0 |
| Coefficient of linear expansion (ppm/K) | 68 | 48 |
| Poisson's ratio | 0.35 | 0.35 |
| Connection reliability | 14/38 | 19/38 |

As shown in Table 11, comparative examples No. 31 and No. 32 showed significantly inferior connection reliability in comparison with the examples of the present invention in the previously described Test Example 2.

Test Example 4

Test Example 4 will next be described. In Test Example 154, evaluation boards were fabricated using resin materials containing the components shown in Table 12 as reactive elastomer (A). The components of the resin materials are shown in Table 13. the low-CN polyamide elastomers shown in Table 12 are polyamide elastomers that do not contain a cyanate group (CN), and the chemical formulae thereof can be indicated as a case in which y=0 in Formula 15. Epofriend AT501 manufactured by Daicel Chemical Industries was used as the flexible epoxy resin shown in Table 12. Furthermore, SG-9 manufactured by Nippon Talc was used as the inorganic filler shown in Table 13. The average grain diameter of this inorganic filler is 2.5 μm. Among the components shown in Table 13, components other than those shown in Table 12 are the same as the components shown in Table 3.

TABLE 12

| Component | | Type | | Molecular Weight (MW) | Hydroxyl Equivalent (g/eq) | Epoxy Equivalent (g/eq) |
|---|---|---|---|---|---|---|
| Reference Symbol | Name of Substance | Reference Symbol | Name of Substance | | | |
| A | Reactive elastomer | A3 | Low-CM polyamide elastomer | 60000 | 5000 | — |
| | | A4 | Low-CM polyamide elastomer | 20000 | 5000 | — |
| | | A5 | Flexible epoxy resin | — | — | 1070 |

TABLE 13

| No. | | 18 Ex. | 41 Ex. | 42 Ex. | 43 Ex. | 44 Ex. | 45 Ex. | 46 Ex. |
|---|---|---|---|---|---|---|---|---|
| Polyamide elastomer A1 | | 75 | | | | | | |
| Low-CN polyamide elastomer A3 | | | 75 | | | | | |
| Low-CN polyamide elastomer A4 | | | | 75 | | | | |
| Flexible epoxy resin A5 | | | | | 60 | 65 | 75 | 39 |
| Epoxy resin B1 | | 18.71 | 18.71 | 18.71 | 27 | 24 | 17 | 14 |
| Epoxy resin curing agent C1 | | 6.29 | 6.29 | 6.29 | | | | |
| Epoxy resin curing agent D2 | | | | | 13 | 11 | 8 | 7 |
| Inorganic filler | | | | | | | | 40 |
| Curing-promoting catalyst (phr) | | 0.05 | 0.05 | 0.05 | 0.05 | 0.05 | 0.05 | 0.05 |
| Toughness | Elongation at break (%) | 87 | 52 | 50 | 150 | 250 | 350 | 120 |
| | Young's modulus (GPa) | 0.62 | 0.63 | 0.64 | 0.30 | 0.11 | 0.08 | 0.30 |
| Circuit embedding properties | 180° C. × 30 minutes | ○ | ○ | ◎ | ◎ | ◎ | ◎ | ◎ |
| | 180° C. × 5 minutes | ○ | ○ | ◎ | ◎ | ◎ | ◎ | ◎ |
| | 140° C. × 20 seconds | Δ | Δ | ◎ | ◎ | ◎ | ◎ | ◎ |
| | 100° C. × 20 seconds | Δ | Δ | ◎ | ◎ | ◎ | ○ | Δ |
| Connection reliability | | 0/38 | 0/38 | 0/38 | 0/38 | 0/38 | 0/38 | 0/38 |
| Insulation reliability (time) | | 300 | Over 500 | Over 500 | Over 500 | Over 500 | Over 500 | Over 500 |

Figure 6:
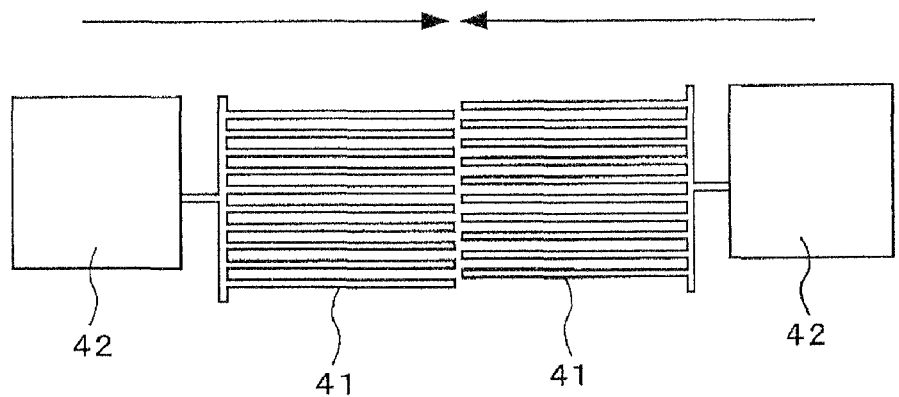
FIG. 6 is a diagram showing an overview of the evaluation board created in Test Example 4.
Figure 7:
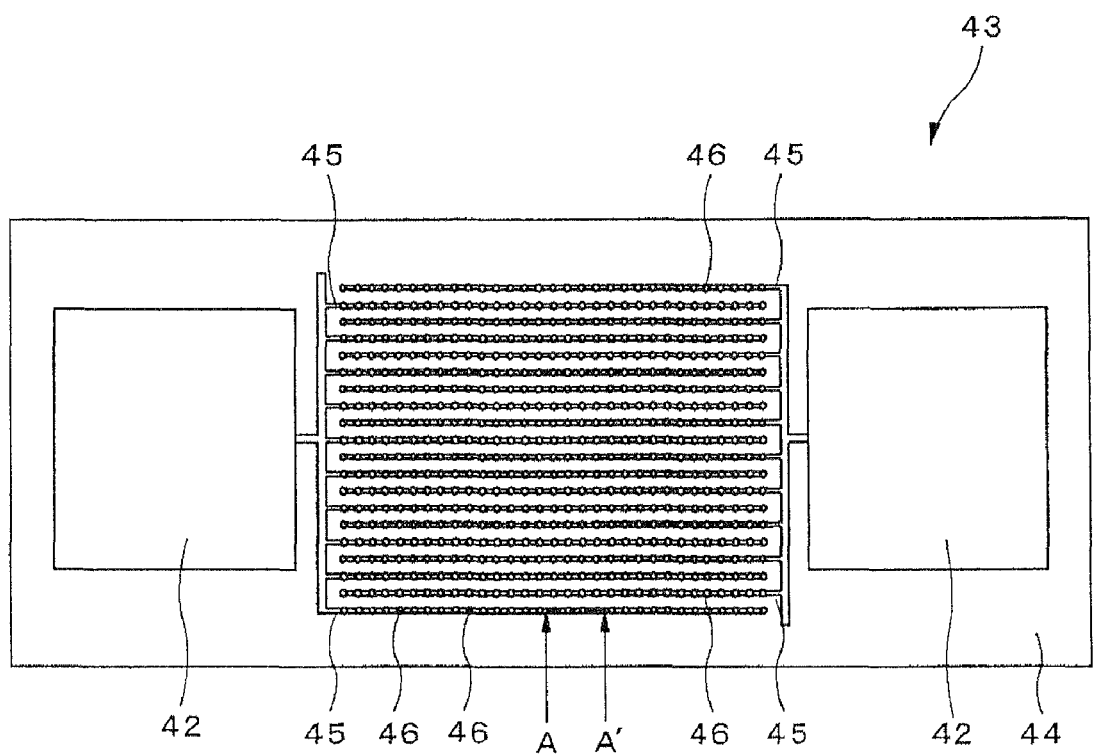
FIG. 7 is a plan view showing details of the evaluation board.
Figure 8:
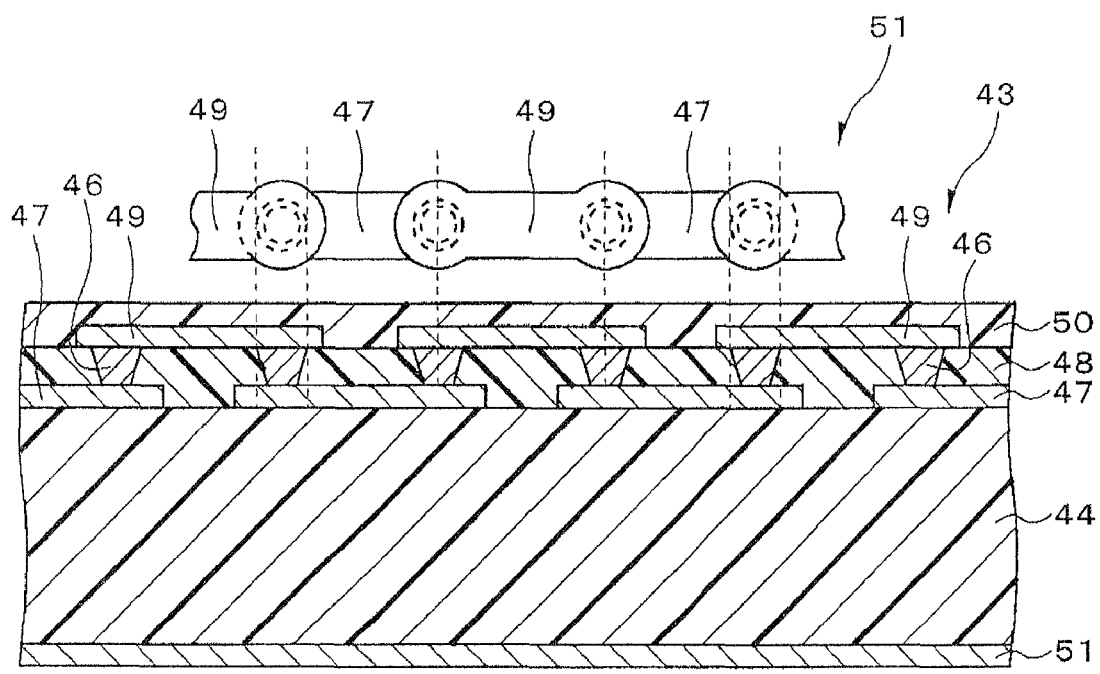
FIG. 8 is an enlarged sectional view of a portion of the evaluation board.

FIG. 6 is a diagram showing an overview of the evaluation board created in the present test example. FIG. 7 is a plan view showing details of the evaluation board. FIG. 8 is an enlarged sectional view of a portion of the evaluation board. FIG. 8 also shows the planar shape of the wiring 45. As shown in FIG. 6, this evaluation board is configured so that comb-shaped wirings 41 in a pair are nested in each other. Specifically, the pair of comb-shaped wirings 41 is arranged so that the teeth of one of the comb-shaped wirings 41 are positioned between the teeth of the other comb-shaped wiring 41, and the comb-shaped wirings 41 are arranged so as not to touch each other. The comb-shaped wirings 41 are also connected to square electrodes 42.

As shown in FIG. 7, an FR-4 board 44 as a core is provided to the evaluation board 43. The external shape of the board 44 is such that the length in the longitudinal direction is 24.4 mm, the length in the transverse direction is 8.0 mm, and the thickness is 0.8 mm. Two electrodes 42 are arranged on the surface of the board 44 so as to be separated from each other in the longitudinal direction of the board 44. The length of one side of the electrodes 42 as viewed from above is 5.2 mm. Two comb-shaped wirings 41 are arranged so as to be nested in each other in the region between the electrodes 42. Ten wires 45 are provided to each comb-shaped wiring 41 as the teeth thereof. The length of each wire 45 is 8.7 mm. Thirty vias 46 are also formed in each wire 45. Specifically, the total number of vias 46 provided to the evaluation board 43 is 2×10×30=600. These 600 vias 46 are arranged in a (20×30) matrix. The arrangement pitch of the vias is 300 μm in both directions.

As shown in FIG. 8, a Cu pattern 47 composed of Cu is continuously provided along the direction in which the wiring 45 extends on the surface of the board 44. A buildup resin layer 48 having a thickness of 50 μm is provided so as to cover the Cu pattern 47. The buildup resin layer 48 is formed from any of the resins shown in Table 13. A Cu pattern 49 composed of Cu is also continuously provided along the direction in which the wiring 45 extends on the buildup resin layer 48. Each of the Cu patterns 47 and 49 comprises two circular portions having a diameter of 150 μm linked together by a rectangular portion as viewed from above, and the thickness thereof is 18 μm. The rectangular portion of the Cu pattern 49 is positioned in the area directly above the region between the Cu patterns 47, and the circular portions of the Cu pattern 49 are positioned in the areas directly above the circular portions of the Cu pattern 47.

A single via 46 is positioned between each circular portion of the Cu pattern 49 and each circular portion of the Cu pattern 47 in the buildup resin layer 48, and these vias 46 connect the Cu pattern 47 and the Cu pattern 49 to each other. The vias 46 are shaped like a truncated cone with a diameter of 100 μm at the top end and a diameter of 75 μm at the bottom end. The distance between two vias connected to the same Cu pattern 47 or 49 is 300 μm, as described above. A solder resist 50 having a thickness of 35 μm is provided so as to cover the buildup resin layer 48. A Cu pattern 51 having a thickness of 18 μm is also provided over the entire back surface of the board 44. The buildup resin layer 48 and the solder resist 50 are omitted from FIG. 7 for convenience.

(8) Evaluation of Insulation Reliability

A HAST (Highly Accelerated temperature humidity Stress Test) was conducted using the evaluation board 43 fabricated as described above. The test conditions were a temperature of 130° C., a humidity of 85 RH %, and a voltage of 5 V applied across the electrodes. The time until the resistance between the electrodes 42 reached $1 \times 10^9 \Omega$ or lower was measured and used as an indicator for evaluating the reliability of the insulation. A longer time can be considered to indicate superior insulation reliability. Testing was conducted for a maximum of 500 hours. The test results are shown in Table 13. In Table 13, "lover 500" indicates a case in which the resistance between the electrodes did not reach 1×10$^9$Ω or lower even when testing was continued for 500 hours.

The circuit embedding properties were also evaluated. The evaluation method used was the same as the testing method described in "(6) Evaluation of circuit embedding properties" in Test Example 2. Besides Condition 1 below, which is the same condition used in Test Example 2, Conditions 2 through 4 below were added to the lamination conditions, making a total of four conditions.

Condition 1: temperature: 180° C.; time: 30 minutes
Condition 2: temperature: 180° C.; time: 5 minutes
Condition 3: temperature: 140° C.; time: 20 seconds
Condition 4: temperature: 100° C.; time: 20 seconds The evaluation results are shown in Table 13. In the results, a ⊚ was used to indicate cases in which the circuit embedding properties were particularly good, a ○ was used to indicate cases in which the results were sufficiently good for practical use, and a Δ was used to indicate cases in which the results were inferior to ⊚ and ○, but still enabled practical use.

As shown in Table 13, the HAST results were all 300 hours or higher for example No. 18 and examples No. 41 through No. 46, and good insulation reliability was indicated. The insulating properties, particularly in examples No. 41 through No. 46, were not compromised even after up to 500 hours of HAST, and extremely good insulation reliability was evident. The reason for this is considered to be that since the low-CN polyamide elastomers (A3 and A4) and the flexible epoxy resin (A5) shown in Table 12 do not contain cyanate groups, Cu-dissolving ammonia is less likely to form. Examples No. 42 through No. 46 also had good circuit embedding properties in comparison with examples No. 18 and No. 41. Among these, examples No. 42. through No. 45 had particularly good circuit embedding properties.

INDUSTRIAL APPLICABILITY

The present invention can be used in a semiconductor device in which a semiconductor chip is directly mounted on an FCBGA or other wiring board.

The invention claimed is:

1. A wiring board in which a plurality of wiring layers composed of wiring and an insulating material are layered, said wiring board characterized in that
said insulating material for forming said wiring layers disposed on a surface electrically connected to an external element is formed of a material comprising a reactive elastomer (A), an epoxy resin (B), and an epoxy resin curing agent (C), wherein the value (A×100)/(A+B+C) is 50 mass % or higher and less than 100 mass %, where A is the content of the reactive elastomer, B is the content of the epoxy resin, and C is the content of the epoxy resin curing agent, said insulating material having a Young's modulus of 1 GPa or lower in a temperature range of 10 to 30° C. and an elongation at break of 50% or higher.

2. The wiring board according to claim 1, wherein
the insulating material for forming at least one wiring layer among said wiring layers other than the wiring layer disposed on the surface electrically connected to said external element is a material having a Young's modulus of 1 GPa or lower in a temperature range of 10 to 30° C.

3. The wiring board according to claim 1, further comprising a reinforcing panel bonded to at least one surface thereof.

4. A semiconductor device comprising:
the wiring board according to claim 1;
a semiconductor chip; and
a plurality of terminals for connecting said wiring board and said semiconductor chip to each other; wherein
the insulating material for forming said wiring layer disposed on the side of said wiring board on which said semiconductor chip is mounted is a material having a Young's modulus of 1 GPa or lower.

5. The semiconductor device according to claim 4, further comprising:
a plurality of other terminals connected to the side of said wiring board on which said semiconductor chip is mounted, for connecting said wiring board to a circuit board.

6. The semiconductor device according to claim 4, further comprising:
a plurality of other terminals connected to a different side of the wiring board from the side on which said semiconductor chip is mounted, for connecting said wiring board to a circuit board.

7. The semiconductor device according to claim 6, wherein
said insulating material for forming said wiring board disposed on the side to which said other terminals are connected is a material having a Young's modulus of 1 GPa or lower in a temperature range of 10 to 30° C.

8. The semiconductor device according to claim 4, wherein said terminals are solder balls.

9. The semiconductor device according to claim 4, wherein said terminals are a solder paste.

10. A semiconductor device comprising:
the wiring board according to claim 1;
a semiconductor chip;
a plurality of terminals for connecting said wiring board and said semiconductor chip to each other; and
a plurality of other terminals connected to the side of said wiring board other than the side on which said semiconductor chip is mounted, for connecting said wiring board to a circuit board; wherein
the insulating material for forming said wiring board disposed on the side of said wiring board mounted to said circuit board is said material having a Young's modulus of 1 GPa or lower.

* * * * *